(12) United States Patent
Kinder et al.

(10) Patent No.: US 7,897,516 B1
(45) Date of Patent: Mar. 1, 2011

(54) USE OF ULTRA-HIGH MAGNETIC FIELDS IN RESPUTTER AND PLASMA ETCHING

(75) Inventors: Ronald L. Kinder, Oakland, CA (US); Anshu A. Pradhan, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 821 days.

(21) Appl. No.: 11/807,183

(22) Filed: May 24, 2007

(51) Int. Cl.
*H01L 21/302* (2006.01)

(52) U.S. Cl. .................. 438/695; 438/696; 438/710; 438/720; 438/732; 216/37; 216/67; 216/70; 216/75; 216/78

(58) Field of Classification Search .................. 438/710
See application file for complete search history.

(56) References Cited

U.S. PATENT DOCUMENTS

| | | | |
|---|---|---|---|
| 3,763,031 A | 10/1973 | Scow et al. | |
| 3,767,551 A | 10/1973 | Lang et al. | |
| 4,058,430 A | 11/1977 | Suntola et al. | |
| 4,392,111 A * | 7/1983 | Rostoker | 315/504 |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A | 10/1989 | Pan | |
| 4,963,524 A * | 10/1990 | Yamazaki | 505/400 |
| 4,999,096 A | 3/1991 | Nihei et al. | |
| 5,009,963 A | 4/1991 | Ohmi et al. | |

(Continued)

FOREIGN PATENT DOCUMENTS

CN    1567548    1/2005

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner*—Anita K Alanko
*Assistant Examiner*—Christopher M Remavege
(74) *Attorney, Agent, or Firm*—Weaver Austin Villeneuve & Sampson LLP

(57) ABSTRACT

Methods for resputtering and plasma etching include an operation of generating an ultra-high density plasma using an ultra-high magnetic field. For example, a plasma density of at least about $10^{13}$ electrons/cm$^3$ is achieved by confining a plasma using a magnetic field of at least about 1 Tesla. The ultra-high density plasma is used to create a high flux of low energy ions at the wafer surface. The formed high density low energy plasma can be used to sputter etch a diffusion barrier or a seed layer material in the presence of an exposed low-k dielectric layer. For example, a diffusion barrier material can be etched with a high etch rate to deposition rate (E/D) ratio (e.g., with E/D>2) without substantially damaging an exposed dielectric layer. Resputtering and plasma etching can be performed, for example, in iPVD and in plasma pre-clean tools, equipped with magnets configured for confining a plasma.

25 Claims, 19 Drawing Sheets

U.S. PATENT DOCUMENTS

| | | | |
|---|---|---|---|
| 5,084,412 A | 1/1992 | Nakasaki | |
| 5,126,028 A | 6/1992 | Hurwitt et al. | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A | 5/1999 | Nguyen et al. | |
| 5,948,215 A | 9/1999 | Lantsman | |
| 5,962,923 A | 10/1999 | Xu et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,403 A | 6/2000 | Kobayashi et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,105,078 A | 8/2000 | Crockett et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 * | 6/2001 | Fu et al. | 204/298.19 |
| 6,265,313 B1 | 7/2001 | Huang et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 * | 1/2002 | D'Couto et al. | 204/192.17 |
| 6,342,448 B1 | 1/2002 | Lin et al. | |
| 6,350,353 B2 | 2/2002 | Gopalraja et al. | |
| 6,358,376 B1 | 3/2002 | Wang et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zhao et al. | |
| 6,436,251 B2 | 8/2002 | Gopalraja et al. | |
| 6,440,854 B1 | 8/2002 | Rozbicki | |
| 6,444,104 B2 | 9/2002 | Gopalraja et al. | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,624,066 B2 | 9/2003 | Lu et al. | |
| 6,642,146 B1 * | 11/2003 | Rozbicki et al. | 438/687 |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,683,425 B1 | 1/2004 | Lai | |
| 6,706,142 B2 * | 3/2004 | Savas et al. | 156/345.48 |
| 6,706,155 B2 | 3/2004 | Morimoto et al. | |
| 6,709,557 B1 | 3/2004 | Kailasam et al. | |
| 6,709,987 B2 | 3/2004 | Hashim et al. | |
| 6,755,945 B2 | 6/2004 | Yasar et al. | |
| 6,758,947 B2 | 7/2004 | Chiang et al. | |
| 6,764,940 B1 | 7/2004 | Rozbicki et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 | 5/2005 | Chiang et al. | |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Hashim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 7,510,634 B1 | 3/2009 | Klawuhn et al. | |
| 7,645,696 B1 | 1/2010 | Dulkin et al. | |
| 7,659,197 B1 | 2/2010 | Juliano | |
| 7,682,966 B1 | 3/2010 | Rozbicki et al. | |
| 7,732,314 B1 | 6/2010 | Danek et al. | |
| 2001/0039113 A1 | 11/2001 | Blalock et al. | |
| 2002/0000382 A1 | 1/2002 | Morrissey et al. | |
| 2002/0028576 A1 | 3/2002 | Hashim et al. | |
| 2002/0041028 A1 | 4/2002 | Choi et al. | |
| 2002/0110999 A1 | 8/2002 | Lu et al. | |
| 2002/0115287 A1 | 8/2002 | Hashim et al. | |
| 2003/0034244 A1 | 2/2003 | Yasar et al. | |
| 2003/0116427 A1 | 6/2003 | Ding et al. | |
| 2003/0129828 A1 | 7/2003 | Cohen | |
| 2003/0216035 A1 | 11/2003 | Rengarajan et al. | |
| 2004/0048461 A1 | 3/2004 | Chen | |
| 2004/0094402 A1 | 5/2004 | Gopalraja et al. | |
| 2004/0152301 A1 | 8/2004 | Hashim et al. | |
| 2004/0171250 A1 | 9/2004 | Chiang et al. | |
| 2004/0188239 A1 | 9/2004 | Robison et al. | |

| | | |
|---|---|---|
| 2004/0211661 A1 | 10/2004 | Zhang et al. |
| 2004/0224507 A1 | 11/2004 | Marieb et al. |
| 2004/0266175 A1 | 12/2004 | Chen et al. |
| 2005/0006222 A1 | 1/2005 | Ding et al. |
| 2005/0020080 A1 | 1/2005 | Chiang et al. |
| 2005/0032382 A1 | 2/2005 | Rossman |
| 2005/0085068 A1 | 4/2005 | Chiang et al. |
| 2005/0085070 A1 | 4/2005 | Park |
| 2005/0103620 A1 | 5/2005 | Chistyakov |
| 2005/0106865 A1 | 5/2005 | Chung et al. |
| 2005/0110147 A1 | 5/2005 | Wu et al. |
| 2005/0173239 A1 | 8/2005 | Somekh et al. |
| 2005/0186793 A1 | 8/2005 | Omoto et al. |
| 2005/0211545 A1 | 9/2005 | Cerio, Jr. et al. |
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0255700 A1 | 11/2005 | Gopalraja et al. |
| 2005/0266682 A1 | 12/2005 | Chen et al. |
| 2005/0272254 A1 | 12/2005 | Ding et al. |
| 2006/0014378 A1 | 1/2006 | Aggrawal et al. |
| 2006/0024953 A1 | 2/2006 | Papa Rao et al. |
| 2006/0030151 A1 | 2/2006 | Ding et al. |
| 2006/0057843 A1 | 3/2006 | Chen et al. |
| 2006/0125100 A1 | 6/2006 | Arakawa |
| 2006/0148253 A1 | 7/2006 | Chung et al. |
| 2006/0207873 A1 | 9/2006 | Fu |
| 2006/0258152 A1 | 11/2006 | Haider |
| 2007/0020922 A1 | 1/2007 | Chiang et al. |
| 2007/0178682 A1 | 8/2007 | Chiang et al. |
| 2007/0193982 A1 | 8/2007 | Brown et al. |
| 2007/0197012 A1 | 8/2007 | Yang et al. |
| 2007/0252277 A1 | 11/2007 | Tsao et al. |
| 2007/0283886 A1 | 12/2007 | Chung et al. |
| 2008/0142359 A1 | 6/2008 | Gopalraja et al. |
| 2008/0190760 A1 | 8/2008 | Tang et al. |
| 2008/0310005 A1 | 12/2008 | Tonar et al. |
| 2009/0233438 A1 | 9/2009 | Ding et al. |

FOREIGN PATENT DOCUMENTS

| | | |
|---|---|---|
| EP | 0 692 551 A1 | 1/1996 |
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10.mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.

Ding et al., "Effects of the addition of small amounts of Al to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121 (1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Danek et al., "Barrier First Method for Single Damascene Trench Applications," Novellus Systems, Inc., U.S. Appl. No. 11/714,465, filed Mar. 5, 2007.

U.S. Office Action mailed Jul. 31, 2002, from U.S. Appl. No. 09/862,539.

U.S. Office Action mailed Sep. 16, 2002, from U.S. Appl. No. 09/776,704.
U.S. Office Action mailed Apr. 22, 2002, from U.S. Appl. No. 09/776,704.
U.S. Final Office Action mailed Apr. 3, 2003, from U.S. Appl. No. 09/816,847.
U.S. Office Action mailed Oct. 4, 2002, from U.S. Appl. No. 09/816,847.
U.S. Office Action mailed Oct. 23, 2002, from U.S. Appl. No. 09/965,472.
U.S. Office Action mailed Oct. 3, 2003, from U.S. Appl. No. 10/412,562.
U.S. Final Office Action mailed Mar. 23, 2006, from U.S. Appl. No. 10/804,353.
U.S. Office Action mailed Oct. 3, 2006, from U.S. Appl. No. 10/804,353.
U.S. Office Action mailed Aug. 28, 2002, from U.S. Appl. No. 09/975,612.
U.S. Office Action mailed Jun. 15, 2004, from U.S. Appl. No. 10/289,237.
U.S. Office Action mailed Dec. 19, 2002, from U.S. Appl. No. 10/121,949.
Klawuhn et al., "Apparatus and Methods for Deposition and/or Etch Selectivity," Novellus Systems, Inc., U.S. Appl. No. 11/558,693, filed Nov. 10, 2006.
Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.
Dulkin et al., "Method and Apparatus for Controlling Sputtered Flux in PVD Sources," Novellus Systems, Inc., U.S. Appl. No. 11/564,222, filed Nov. 28, 2006.
Kailasam et al., "Resputtering Process for Eliminating Dielectric Damage," Novellus Systems, Inc., U.S. Appl. No. 11/588,586, filed Oct. 26, 2006.
Lu et al., "An Integrated Plasma Equipment-feature Scale Model for Ionized Metal Physical Vapor Deposition", Jun. 2000, University of Illinois (16 pages).
Font et al., "Scaling of Hollow Cathode Magnetrons for Metal Deposition", Oct. 1999, University of Illinois (20 pages).
Rozbicki, R., "Methods and Apparatus for Resputtering Process that Improves Barrier Coverage," Novellus Systems, Inc., U.S. Appl. No. 11/830,777, filed Jul. 30, 2007.
Rozbicki et al., "Multistep Method of Depositing Metal Seed Layers," Novellus Systems, Inc., U.S. Appl. No. 11/701,984, filed Feb. 1, 2007.
Pradhan et al., "Atomic Layer Profiling of Diffusion Barrier and Metal See Layers," Novellus Systems, Inc., U.S. Appl. No. 11/807,179, filed May 24, 2007.
Juliano, D., "Selective Resputtering of Metal Seed Layers," Novellus Systems, Inc., U.S. Appl. No. 11/903,487, filed Sep. 21, 2007.
Vijayendran et al., "Gas Treatment Method and Apparatus to Improve Copper Gap Fill," U.S. Appl. No. 11/131,599, filed May 18, 2005.
Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.
Hoekstra et al., "Microtenching resulting from specular reflection during chlorine etching of silicon," J.Vac. Sci. Technol. B 16(4), Jul./Aug. 1998, pp. 2102-2104.
Lane et al., "Feature evolution during plasma etching. II. Polycrystalline silicone etching," J.Vac. Sci. Technol. A 18(1), Jan./Feb. 2000, pp. 188-196.
Rozbicki R., "A Method of Enhancing Selectivity of Resputtering Process," Novellus Systems, Inc., U.S. Appl. No. 11/977,355, filed Oct. 23, 2007.
Pradhan et al., "Method and Apparatus for Increasing Local Plasma Density in Magnetically Confined Plasma," Novellus Systems, Inc., U.S. Appl. No. 11/807,182, filed May 24, 2007.
Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.
Wu et al., "Deposition of Doped Copper Seed Layers Having Improved Reliability," Novellus Systems, Inc., U.S. Appl. No. 12/122,118, filed May 16, 2008.
U.S. Office Action mailed Jun. 26, 2008, from U.S. Appl. No. 11/473,618.
U.S. Office Action mailed May 2, 2008, from U.S. Appl. No. 11/558,693.
U.S. Office Action mailed Dec. 12, 2008, from U.S. Appl. No. 11/714,465.
Notice of Allowance and Fee Due mailed Nov. 24, 2008, from U.S. Appl. No. 11/558,693.
Allowed Claims from U.S Appl. No. 11/558,693.
U.S. Final Office Action mailed Dec. 10, 2008, from U.S. Appl. No. 11/473,618.
U.S. Office Action mailed Nov. 14, 2008, from U.S. Appl. No. 11/701,984.
Notice of Allowance and Fee Due mailed Apr. 13, 2004, from U.S Appl. No. 10/412,562.
Allowed Claims from U.S Appl. No. 10/412,562.
Notice of Allowance and Fee Due mailed Oct. 3, 2006, from U.S Appl. No. 10/804,353.
Allowed Claims from U.S Appl. No. 10/804,353.
Wu et al., "Methods and Apparatus for Depositing Titanium Based Diffusion Barrier Films," Novellus Systems, Inc., U.S. Appl. No. 12/154,984, filed May 28, 2008.
U.S. Office Action mailed on Mar. 6, 2009 for U.S. Appl. No. 11/903,487.
U.S. Office Action mailed on Feb. 23, 2009 for U.S. Appl. No. 11/701,984.
U.S. Office Action mailed on Mar. 24, 2009 for U.S. Appl. No. 11/473,618.
U.S. Office Action mailed on May 5, 2009 for U.S. Appl. No. 11/588,586.
U.S. Office Action mailed on May 26, 2009 for U.S. Appl. No. 11/564,222.
U.S. Final Office Action mailed Jun. 17, 2009 for U.S. Appl. No. 11/701,984.
U.S. Office Action mailed Jul. 23, 2009 for U.S. Appl. No. 12/122,118.
U.S. Office Action mailed Aug. 3, 2009 for U.S. Appl. No. 11/714,465.
Shaviv et al., "Conformal Films on Semiconductor Substrates" Novellus Systems, Inc., U.S. Appl. No. 12/467,200, filed May 15, 2009.
U.S. Office Action for U.S. Appl. No. 12/154,984, mailed Oct. 6, 2009.
D'Couto et al. J. Vac. Sci. Technol. B. 2001, 19(1), pp. 244-249.
U.S. Final Office Action for U.S. Appl. No. 11/588,586 mailed Nov. 4, 2009.
Rozbicki et al., "Multistep Method of Depositing Metal Seed Layers" Novellus Systems, Inc., U.S. Appl. No. 12/699,738, filed Feb. 3, 2010.
U.S. Office Action mailed Feb. 4, 2010 for U.S. Appl. No. 11/807,179.
U.S. Office Action mailed Mar. 2, 2010 for U.S. Appl. No. 11/807,182.
U.S. Office Action mailed Mar. 5, 2010 for U.S. Appl. No. 11/807,178.
U.S. Notice of Allowance mailed Mar. 8, 2010 for U.S. Appl. No. 11/714,465.
U.S. Final Office Action mailed Mar. 11, 2010 for U.S. Appl. No. 12/122,118.
U.S. Final Office Action mailed Apr. 15, 2010 for U.S. Appl. No. 12/154,984.
Rozbicki et al., "Method of Depositing a Diffusion Barrier for Copper Interconnect Applications," Novellus Systems, Inc., U.S. Appl. No. 12/764,870, filed Apr. 21, 2010.
Notice of Allowance and Allowed Claims mailed Mar. 24, 2010, for U.S. Appl. No. 11/588,586.
Notice of Allowance mailed Jul. 27, 2010, for U.S. Appl. No. 11/807,179.

* cited by examiner

USE OF ULTRA-HIGH MAGNETIC FIELDS IN RESPUTTER AND PLASMA ETCHING

FIELD OF THE INVENTION

The present invention pertains to methods of resputtering layers of material on a partially fabricated integrated circuit. The methods are particularly useful for sputter etching diffusion barrier layers and copper seed layers. The methods can also be applied for sputter etch back of other wafer materials, such as conductive lines.

BACKGROUND OF THE INVENTION

Miniaturization of integrated circuit (IC) devices demands superior electrical properties from both dielectric and conductive materials used in the manufacturing of an integrated circuit. Dielectric materials with low dielectric constant (low-k and ultra low-k dielectrics) have replaced the traditionally used silicon dioxide as an inter-layer dielectric (ILD) material, while copper has replaced aluminum as a conducting material in many applications due to its lower resistivity. The low-k dielectric materials used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps than silicon dioxide.

Currently used IC fabrication processes often include operations that remove or redistribute material on a wafer surface using ions generated in a plasma. These operations are often referred to as sputter etching or resputtering. In such methods, positively charged inert gas ions or metal ions impinge on a negatively biased substrate and remove or redistribute portions of exposed material residing on a wafer substrate. Examples of materials that can be removed or redistributed using sputter etching and resputtering include diffusion barrier materials, such as Ta and TaN$_x$, and seed layer materials, such as copper and its alloys. These materials usually reside on a layer of a low-k dielectric, which can be damaged during plasma etching and resputtering operations, resulting in decreased reliability of the formed IC devices.

As the dimensions of IC devices continue to decrease, and the dielectric materials used in IC fabrication become more delicate, the need for improved methods of sputter etching and resputtering becomes more pronounced.

SUMMARY OF THE INVENTION

This need is herein addressed by providing resputtering methods that employ high density plasma. According to one embodiment, methods for resputtering and plasma etching include an operation of generating an ultra-high density plasma using a confinement with an ultra-high magnetic field. For example, a plasma density of at least about $10^{13}$ electrons/cm$^3$ is achieved by confining a plasma using a magnetic field of at least about 1 Tesla. The ultra-high density plasma is used to create a high flux of low energy ions at the wafer surface. Such high density low energy plasma at the wafer surface can be used to resputter a diffusion barrier or a seed layer material in the presence of an exposed low-k dielectric layer. For example, a diffusion barrier material can be etched with a high etch rate to deposition rate (E/D) ratio (e.g., with E/D>2, E/D>4, and even E/D>6) without substantially damaging an exposed dielectric layer. Resputtering and plasma etching can be performed, for example, in an iPVD or in a plasma pre-clean tool equipped with one or several magnets configured for confining a plasma. For example a hollow cathode magnetron (HCM) or a planar magnetron can be configured to perform processes in accordance with the methods provided herein.

Advantageously, in some embodiments, the wafer encounters a high flux of low energy ions, which do not have sufficient energy to damage the dielectric layer. Specifically, microtrenching of the dielectric layer and incorporation of sputtering ions into the dielectric can be substantially minimized, and, in some cases, avoided. Dielectric surface roughening can also be reduced. The reduction in dielectric damage results in improved adhesion of subsequently deposited layers, and, consequently, in improved reliability of the formed IC devices. Further, elimination of microtrenching results in reduced line-to-line leakage due to elimination of regions of excessively high current density. Microtrenching can be avoided by using an ion flux having low ion energy, such as a flux having an ion energy of less than about 250 eV at the exposed wafer surface. In some embodiments, provided methods allow efficient resputtering using ion fluxes characterized by low ion energy.

Further, in the provided processes, the wafer encounters a plasma having a high fractional ionization. Since ions impinging on the wafer surface are responsible for sputter etching, while neutral metal atoms are responsible for deposition component during resputter, high fractional ionization leads to increased etch rate and to decreased deposition rate thereby resulting in increased E/D ratio and higher net etch rate. For example E/D ratios of greater than 2, 4, and even 10 can be achieved. High E/D ratios are highly desirable during some of the resputtering operations, which can be integrated into the process flows for depositing diffusion barrier and seed layers. Provided resputtering methods characterized by high E/D ratios can increase throughput parameters of these deposition processes.

In one aspect, a method of removing material on a semiconductor wafer having a recessed feature (e.g., a via) includes the operations of receiving the semiconductor wafer having a layer of material coating at least a bottom portion of the recessed feature; generating an ultra-high density plasma, which includes inert gas ions and has a plasma density of at least about $10^{13}$ electrons/cm$^3$; and removing at least a portion of the material by impinging on that layer with ions generated by ultra-high density plasma.

The layer of material in the received semiconductor wafer can be deposited by a variety of methods, e.g., by PVD, CVD, ALD, electroplating, or an electroless deposition. In some embodiments it is advantageous to perform the depositing of the material and the removing of its portion in one process chamber, e.g. in a PVD process chamber, which may include a hollow cathode magnetron or a planar magnetron.

The removed material can include, in one embodiment, a diffusion barrier material, such as Ta, TaN$_x$, Ti, TiN$_x$, W, WN$_x$, Ru, or Co. In another embodiment the material can include a seed layer material, such as copper and its alloys. In some embodiments, an exposed top portion of a metal line, e.g., a portion of a copper line residing at a via bottom, is removed at the bottom of a via to form an anchor recess.

The generated ultra-high density plasma, in one embodiment, includes both inert gas ions and metal ions. For example, such plasma can be generated in an iPVD system comprising a target. In another embodiment, the ultra-high density plasma does not include metal ions. Such plasma can be generated, for example, in a plasma pre-clean apparatus that does not have a metal target.

Material removal can be performed in a resputtering operation that may include an etch and a deposition component. The E/D ratio during such resputtering can be at least about 2, e.g., at least about 4, at least at one location on the wafer, e.g., at a via bottom.

In one embodiment, the provided method includes receiving a wafer having a layer of dielectric coated with a diffusion barrier layer and/or a seed layer; and exposing a layer of dielectric during material removal operation, such that the dielectric is contacted with inert gas ions generated in the ultra-high density plasma. The method advantageously removes a portion of the barrier layer and/or seed layer material without substantially damaging the dielectric layer. Significantly, high E/D ratios can be achieved during the material removal operation. For example, E/D ratios of at least about 2, e.g., at least about 4 can be obtained without substantially damaging the dielectric, such as a low-k dielectric (e.g., a dielectric with k<3.5, or k<2.8) or an ultra low-k dielectric (e.g., a dielectric with k<2.5). A variety of low-k dielectrics including porous low-k dielectrics can be used in conjunction with provided methods. For example, carbon doped silicon dioxide, hydrogenated silicon oxycarbides (SiCOH), fluorine doped silicon dioxide, and organic-containing low-k dielectrics can be used.

When material removal is performed in a PVD-type apparatus, a variety of apparatus configurations can be employed. In some embodiments, an apparatus that allows plasma confinement with a plurality of magnets and has a three-dimensional target is preferred. An example of such an apparatus is an HCM. In other embodiments, an ultra-high density plasma can be generated in a planar magnetron. In some embodiments, capacitively coupled plasma is preferred over inductively coupled plasma (ICP). In other embodiments methods provided herein can be used in PVD reactors that employ ICP plasma and combinations of capacitively coupled plasma and ICP.

According to one embodiment, the ultra-high density plasma is generated by employing an ultra-high magnetic field, which serves to shape and confine the plasma. For example, a magnetic field of at least about 1 Tesla can be used for generating an ultra-high density plasma in a volume of less than about 0.5 m$^3$. In some embodiments, the ultra-high density plasma is generated and maintained at some distance from the wafer (e.g., in the vicinity of the target). In these embodiments the ultra-high density plasma does not contact the wafer. However, the plasma density at the wafer surface is typically sufficiently high and ion energy at the wafer surface is sufficiently low, to result in efficient material removal without substantial dielectric damage. In one embodiment, the plasma density in the vicinity of the wafer is at least about $10^{12}$ electrons/cm$^3$. The inert gas in the vicinity of the wafer can be ionized to at least about 5%, e.g., to at least about 20%.

In another aspect, a method of depositing material on a semiconductor wafer having a recessed feature includes an operation of depositing a layer of the material on the wafer to coat at least the bottom portion of the recessed feature and an operation of removing at least a portion of the material by impinging on the layer of material with ions having a mean ion energy of less than about 250 eV and an ion flux at the wafer surface of greater than about $5 \cdot 10^{15}$ cm$^{-2}$s$^{-1}$. Such ion flux can be formed by generating an ultra-high density plasma having a plasma density of at least about $10^{13}$ electrons/cm$^3$, e.g., using an ultra-high magnetic field confinement.

In another aspect, a method of resputtering a material on an electrically biased semiconductor wafer is provided. The method achieves higher E/D ratios during resputter for a given electrical bias at the wafer. In one embodiment, the method comprises simultaneously etching and depositing the material on the wafer by contacting the exposed wafer surface with inert gas ions, neutral metal atoms, and/or ionized metal atoms, such that an E/D ratio at least at one location on the wafer of at least about 2 is achieved at the bias power at the wafer of less than about 1000 W. For example, an E/D ratio of greater than 4 can be achieved in the bias range of about 50-1000 W, e.g., at low bias power of 50-200 W.

In yet another aspect, an apparatus for removing material on a semiconductor wafer having a recessed feature and a layer of metal-containing material is provided. The apparatus includes a process chamber having an inlet for introduction of an inert gas; a wafer support for holding the wafer in position during removal of the material; and a controller with program instructions. The instructions specify, in one embodiment, receiving the semiconductor wafer, generating an ultra-high density plasma comprising inert gas ions having a plasma density of at least about $10^{13}$ electrons/cm$^3$; and removing at least a portion of metal-containing material by impinging on the layer of material with ions generated in the ultra-high density plasma. Examples of such an apparatus include an HCM and a planar magnetron.

These and other features and advantages of the present invention will be described in more detail below with reference to the associated drawings.

DETAILED DESCRIPTION OF PREFERRED EMBODIMENTS

Methods for generating high density plasmas in PVD and plasma pre-clean reactors are herein provided. According to one aspect, these plasmas can be generated by forming an ultra-high density plasma (e.g., a plasma having a plasma density of at least about $10^{13}$ electrons/cm$^3$) in a high confinement regime effected by an ultra-high magnetic field (e.g., a field having a strength of at least about 1 Tesla). These methods can be used in a variety of IC fabrication processes, such as in plasma etching and resputtering. For example, these methods can be used for resputtering diffusion barrier and seed layer materials in Damascene processing. Plasma etching and resputtering will be used interchangeably throughout this document and refer to plasma-based methods in which net material removal is achieved at least at one position on the wafer (e.g., at the via bottom, or at the bottom of the recessed feature being resputtered).

While these methods will be primarily illustrated in the context of plasma etching and resputtering of diffusion barrier and seed layer materials, in general, these methods are not limited to etch-back of these layers, and can be used to remove other materials residing on the wafer surface, e.g., metal line materials.

Examples of diffusion barrier materials that can be etched or redistributed using provided methods include Ta, TaN$_x$, Ta$_x$Si$_y$N$_z$, Ti, TiN$_x$, Ti$_x$Si$_y$N$_z$ W, WN$_x$, W$_x$Si$_y$N$_z$ Ti$_x$Si$_y$N$_z$, Mo, MoN$_x$, Mo$_x$Si$_y$N$_z$, Ru, and Co. Most commonly used barrier materials include Ta, TaN$_x$, Ti, TiN$_x$, W, WN$_x$, Ru, and Co, of which Ta/TaN$_x$ bi-layers are preferred in some embodiments. Examples of seed layer materials to which provided methods apply include but are not limited to Cu, Ni, Ag, Au, Al, Pt and their alloys, of which copper metal and copper alloys are often preferred. For example, alloys of Cu with Al, Mn, Mg, Sn, Zn, B, and with other alloying materials known to those of skill in the art, can be resputtered according to provided methods. In some embodiments, the resputtered material can serve both as a barrier and as a seed layer, e.g., a CuMg or CuMn alloy, Ru, and the like. Commonly, these methods can also be applied to copper line etch-back, e.g., in an anchor-forming process.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing.

Figure 1A:
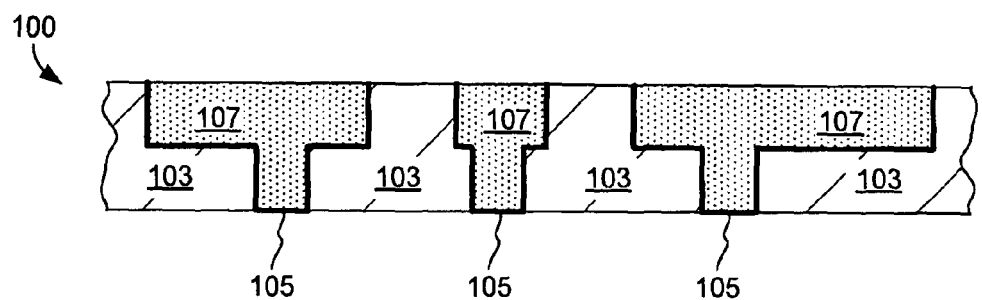
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. Resputtering methods described herein can be integrated into the deposition process flow for the barrier layer 105.

Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed, in some embodiments, using resputtering methods provided herein. After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
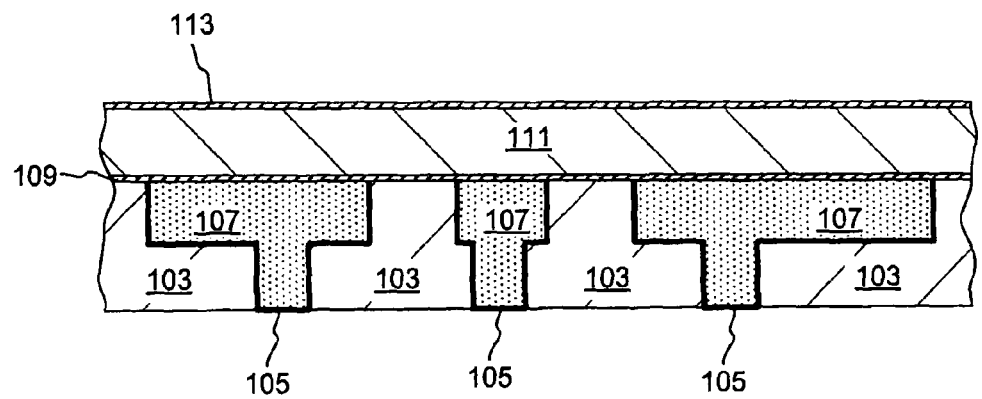

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
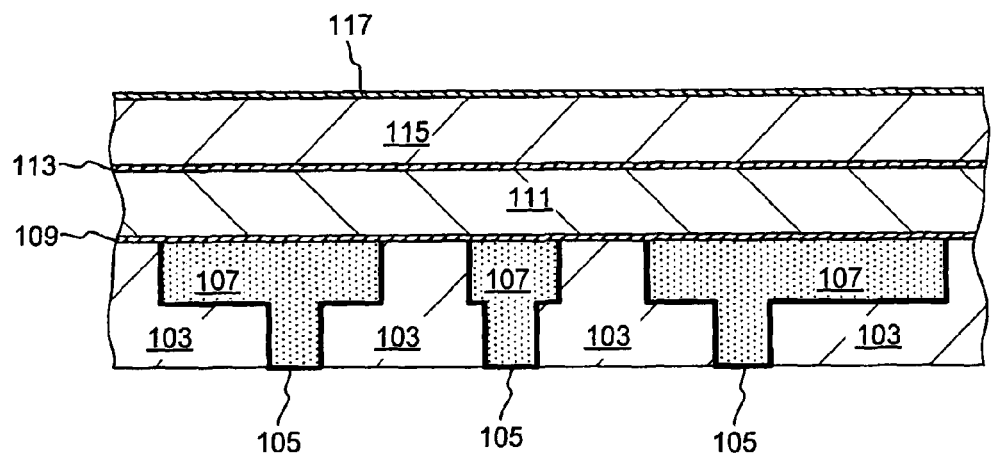

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
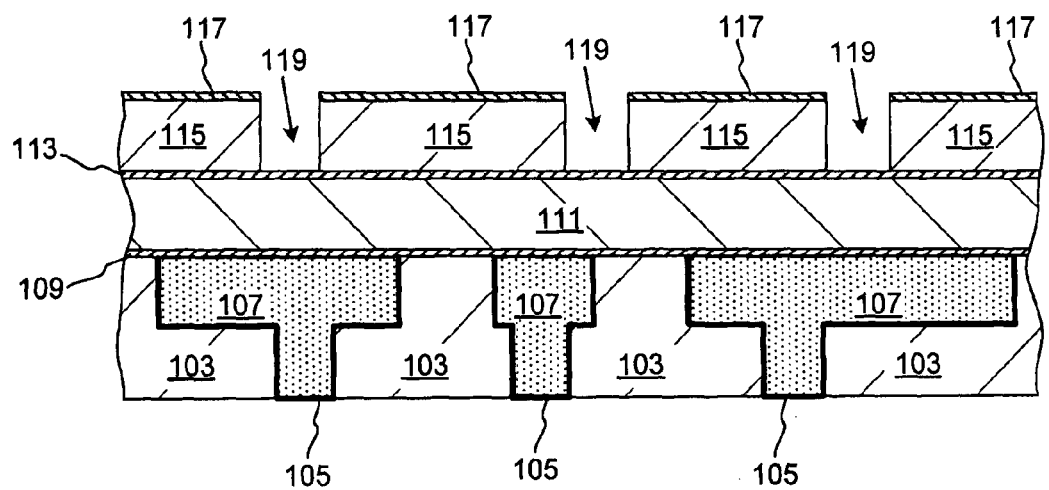
Figure 1E:
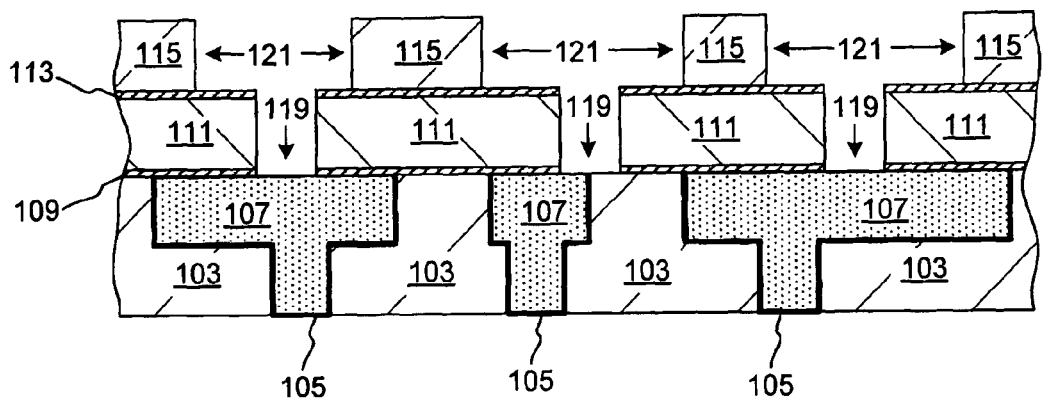

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 1r9 are propagated through etch-stop layer 113, first dielectric layer 111, and diffusion barrier 109.

Figure 1F:
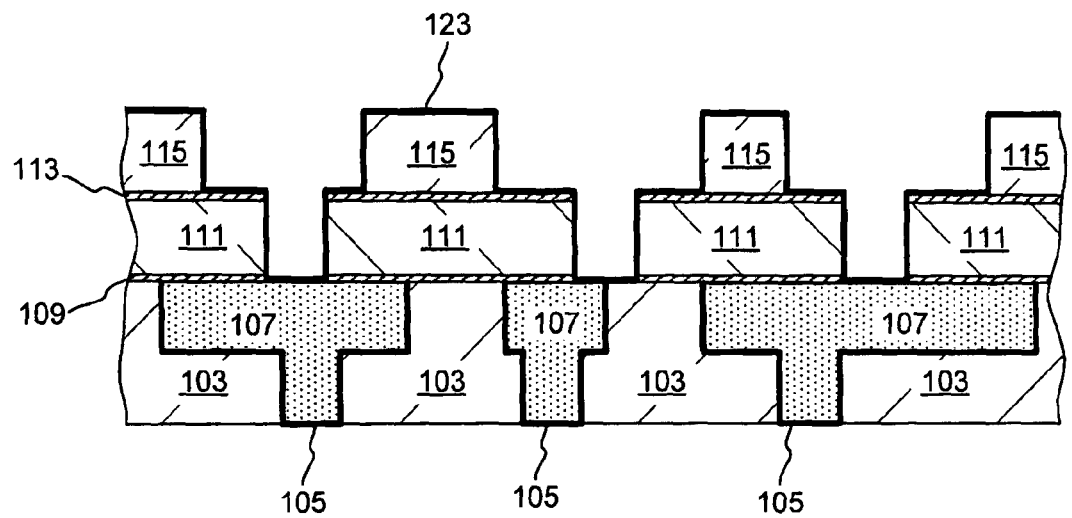

Next, as depicted in FIG. 1F, these newly formed vias and trenches are, as described above, coated with a diffusion barrier 123. The barrier 123 is made of tantalum, or other materials that effectively block diffusion of copper atoms into the dielectric layers. The methods provided herein can be integrated into deposition process flows for a diffusion barrier 123. Example deposition process flows that can make use of the methods provided herein are described in detail in U.S. Pat. No. 6,607,971, issued Aug. 19, 2003 naming Rozbicki et al as inventors, U.S. Pat. No. 6,764,940, issued Jul. 4, 2004 naming Rozbicki et al. as inventors, U.S. Pat. No. 7,186,648, issued Mar. 6, 2007 naming Rozbicki et al. as inventors, and in U.S. patent application Ser. No. 11/588,586, filed Oct. 26, 2006, now U.S. Pat. No. 7,781,327, issued Aug. 24, 2010, naming Kailasam et al. as inventors. U.S. Pat. Nos. 6,607,971, 6,764,940, 7,186,648, and the U.S. patent application Ser. No. 11/588,586 are herein incorporated by reference in their entireties and for all purposes.

An anchoring process that involves removing a portion of metal from underlying metal lines 107 before in conjunction with barrier layer deposition is often performed to increase the reliability of formed interconnects. This process will be described in detail in the following sections.

After diffusion barrier 123 is deposited, a seed layer of copper is applied (typically by a PVD process) to enable subsequent electrofilling of the features with copper inlay. It is understood, that for certain seed layers, such as for certain copper alloys, diffusion barrier 123 may not be required. Such seed layers may themselves possess diffusion barrier properties and may be deposited directly onto a dielectric 115 and 111.

Figure 1G:
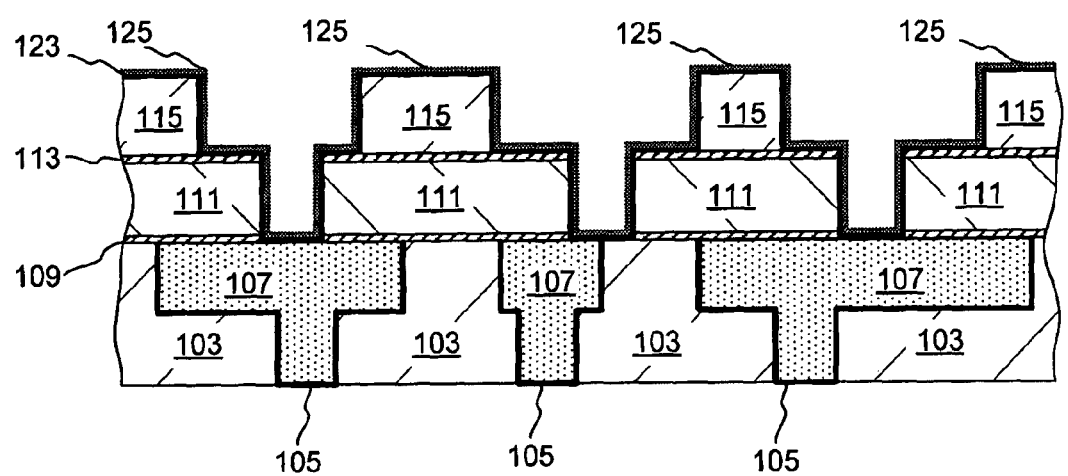
Figure 1H:
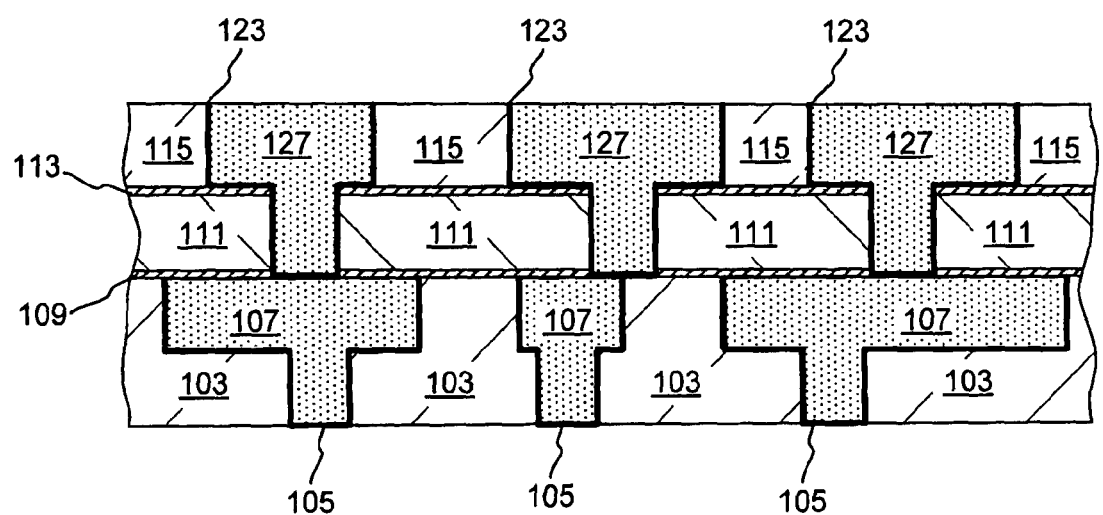

FIG. 1G depicts a copper seed layer 125 deposited on top of the diffusion barrier layer 123. The seed layer should preferably be continuous and should conformally coat the recessed features in order to support an electrofill process. Preferably, thickness of seed layer coverage should not significantly fluctuate depending on its position on the wafer. The resputtering methods described herein can be integrated into deposition process flows for a seed layer 125. Example deposition process flows that can make use of the methods provided herein are described in detail in the U.S. Pat. No. 6,642,146, issued Nov. 4, 2003 naming Rozbicki et al as inventors, and in the U.S. patent application Ser. No. 11/701,984, filed Feb. 1, 2007, now U.S. Pat. No. 7,682,966, issued Mar. 23, 2010, naming Rozbicki et al. as inventors, which are herein incorporated by reference in their entireties and for all purposes.

After the seed layer has been deposited, the recesses are electrofilled with copper. During electrodeposition of copper, the seed layer residing on the wafer serves as a cathode with an electrical contact being made at the edge of the wafer.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

The methods provided herein can be used in resputter operations integrated into the deposition processes for diffusion barrier layers, such as layers 103 and 123; and copper seed layers, such as layer 125. They can be also used for via bottom pre-cleaning, and for forming anchor recesses in the metal lines. Plasma etching and resputtering processes will now be discussed in detail.

In a typical plasma etching or resputtering process according to a method provided herein, a semiconductor wafer having a plurality of recessed features, such as vias and trenches is provided. The material that is subjected to resputtering (e.g., a barrier or a seed layer material) is exposed on the wafer surface and may coat at least some of the surfaces of the recessed features, e.g., via bottoms. The wafer substrate is placed into a PVD process chamber that may include a magnetron having a three-dimensional target (e.g., an HCM) or a planar magnetron, and is held in position on a wafer pedestal.

According to one example process, an inert gas such as argon is introduced into the process chamber at a flow rate ranging from about 10-300 sccm. Other inert gases, such as He, Ne, Kr, Xe, and, in some cases $N_2$, can also be used. The chamber pressure during resputter can be in the range of 0.01-100 mTorr. In some embodiments, the preferred pressure range during resputter is between about 0.5-20 mTorr. In other embodiments, provided methods can be performed in a high pressure resputter regime, e.g., at a pressure of about 40-70 mTorr as described in the U.S. patent application Ser. No. 11/588,586, now U.S. Pat. No. 7,781,327, previously incorporated by reference. In certain embodiments, the wafer is maintained at a temperature of between about −50 and 600° C., or more preferably between about −40 and −20° C. The temperature of the wafer can be controlled, for example, by setting the wafer chuck, such as electrostatic bipolar chuck, to maintain an appropriate temperature at the wafer.

During resputter, a negative DC bias is applied to the metal target (e.g., a tantalum target) residing above the wafer. The DC power can be in the range of about 1-8 kW, preferably about 1-6 kW during resputter. Argon is ionized in the process chamber forming a plasma containing $Ar^+$ ions. One or several magnets are configured to confine or shape the plasma in the process chamber. In one implementation, several electromagnets are circumferentially positioned around a three-dimensional target in an HCM and are configured to generate an ultra-high magnetic field of at least about 1 Tesla, to effect high confinement of a plasma.

By impinging on the negatively biased target, the positively charged argon ions sputter neutral and/or ionized metal atoms (e.g., $Ta^0$ and $Ta^+$) from the target. When the PVD reactor operates in a deposition mode, the wafer is typically not biased or is only slightly negatively biased, causing neutral metal atoms and metal ions to deposit on the wafer without significantly resputtering material on the wafer surface. When the PVD reactor operates in a resputter mode, the negative bias on the wafer causes positively charged ions formed in a plasma (e.g., metal ions and/or inert gas ions) to impinge on a wafer surface with a sufficient momentum to remove atoms of material residing on the wafer surface. Atoms of the etched material may be permanently removed from the wafer, or may be redistributed from one position on the wafer to a different position. For example, material may be redistributed from the bottom of the via to the via sidewalls. Typically, etching and depositing processes are occurring simultaneously in the PVD chamber. Etching is effected by the inert gas ions and, in some cases, by metal ions, impinging on the wafer with a sufficient momentum to dislodge the exposed material, while deposition is effected by neutral metal atoms and, in some cases, by metal ions, being sputtered onto the wafer from the target. When an intrinsic etch rate E is greater than the intrinsic deposition rate D, a net etching process is occurring on the wafer surface. When the etch rate E is smaller than the deposition rate D, the process is characterized as a net deposition.

An etch rate to deposition rate ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1). The resputtering process can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the target and the RF power applied to the wafer. The intrinsic deposition rate D is typically increased as the DC power to the target increases, because larger amounts of metal species are being sputtered from the target. An intrinsic etch rate E is typically increased as the RF power at the wafer increases, since it results in higher energy of inert gas ions and/or metal ions impinging on the wafer. Therefore E/D ratio can be increased by increasing the RF(wafer)/DC(target) power ratio.

It was unexpectedly discovered that resputtering in a high confinement regime, which can be implemented by confining the plasma using ultra-high magnetic fields, results in a dramatic increase in E/D ratios, which can be greater than about 2, greater than about 4, and even greater than about 10. Most advantageously, such high E/D ratios can be achieved at relatively low RF bias power level at the wafer. While the described process is not limited to a low RF bias power regime, and the RF bias power can range from about 50-3000 W during resputter, it is particularly advantageous that high E/D ratios could be achieved when operating at a low power RF bias of about 50-1000 W, preferably 50-500 W, and, in some embodiments, at about 50-400 W. Operation at a low RF bias power is advantageous because lower bias at the wafer reduces the energy of incident ions impinging on the wafer, and, consequently results in decreased dielectric damage.

Etching and resputtering can be used to clean via bottoms, improve sidewall coverage in the vias, shape or remove overhang at the via openings, form anchor recesses at the via bottoms, etc. Resputtering and plasma etching can be easily incorporated into the process flows for diffusion barrier and seed layer deposition. For example, deposition and resputter can be performed sequentially or simultaneously to achieve conformal coverage with a diffusion barrier or seed layer. Diffusion and resputter steps are often repeated in one or more cycles to produce an optimal result. In many of the resputtering processes, it is desirable to achieve high net etch rates at least at one position on the wafer to gain improved efficiency and throughput.

While resputtering in a high E/D mode is often desirable for many of the mentioned processes, conventionally used methods could not easily attain practically feasible resputter with E/D ratios of greater than about 2. When RF power at the wafer is increased in an effort to increase the E rate above a certain level, the energy of the ions bombarding the wafer can become sufficiently high to damage the wafer materials, and, in particular, to damage the dielectric layer, when such dielectric layer is exposed. Several types of dielectric damage arise when resputtering is performed with exceedingly energetic ions (e.g., in the process conducted at a high wafer RF bias). Dielectric microtrenching and surface roughening are examples of such damage. Further, resputtering with highly energetic inert gas ions often leads to incorporation of inert gas atoms into the exposed wafer materials (e.g., dielectric, diffusion barrier and seed layers), thereby weakening their mechanical properties. Microtrenching of the dielectric layer, particularly of delicate low-k dielectric materials, is especially problematic. While the onset of microtrenching may vary depending on the nature of dielectric, with more delicate dielectrics (e.g., porous dielectrics) being more easily damaged, generally it is preferable to resputter at an RF bias power of less than about 800 W (corresponding to an ion energy of oncoming ions of less than about 250 eV), if microtrenching needs to be avoided.

Methods of addressing the microtrenching problem using conventional resputter, are currently limited. While it is possible to conduct a resputtering process without exposing the dielectric layer to plasma, such processes are not always practical. There is currently a strong need for a process that can achieve efficient resputtering in the presence of an exposed dielectric, particularly in the presence of a low-k or an ultra low-k dielectric. While the sputter etching process does not necessarily need to be selective for a metal-containing material over a dielectric material, and certain amount of dielectric etching is permitted in this process, the dielectric damage, such as microtrenching should be substantially minimized.

Methods provided herein address this need by using a high density low energy plasma to effect resputter. High density of ionized species at the wafer increases the E rate and decreases the D rate, under certain conditions, thereby boosting the E/D ratio. Low energy of ions that impinge on the wafer surface does not allow for substantial dielectric damage. In one embodiment, an ion flux of at least about $10^{15}$ ions/cm$^2$ sec, preferably at least about $5 \times 10^{15}$ cm$^{-2}$ s$^{-1}$ is created at the wafer surface, with the ion flux having a mean ion energy of less than about 250 eV. Provided methods can achieve E/D ratios of at least about 2, e.g., at least about 4, and in some cases at least about 8. In some embodiments, resputtering with such E/D ratios is performed in the presence of an exposed low-k dielectric without causing substantial damage (e.g., microtrenching) to the dielectric. Dielectrics having a dielectric constant of less than about 3.5, e.g., less than about 2.8 can be exposed at the wafer surface and can withstand such resputter. Low-k dielectrics include carbon-doped silicon oxide materials (CDOs), hydrogenated silicon oxycarbides (SiCOH), fluorine doped silicon dioxide, and organic-containing low-k dielectrics.

In one embodiment, resputtering with a high E/D ratio and a low ion energy is performed using relatively small RF bias power applied to the wafer. For example E/D ratio of greater than 2 can be achieved with the bias power at the wafer pedestal of less than about 1000 W, e.g., less than about 500 W, and even less than about 200 W. Dielectric damage can be avoided, according to some embodiments, when the RF bias power at the wafer is less than about 800 W, preferably less than about 500 W (which correspond to a voltage of less than about 200 V). High E/D ratios achieved herein allow significant material removal in the presence of an exposed dielectric. For example, more than 500 Å of copper and/or diffusion barrier material, can be removed without forming the microtrenches in the exposed dielectric layer. In a typical resputter process, about 5-1000 Å of material is removed, more typically about 5-600 Å, of a diffusion barrier material, seed layer material, metal line material and their mixtures and combinations can be removed. Provided methods can achieve deep anchoring, e.g., forming 300-700 Å deep anchor recesses, without causing microtrenching in the exposed dielectric layers.

While it is an advantageous feature of the presented methods that they allow resputtering with a high E/D ratio in the presence of an exposed low-k dielectric layer, the invention is not limited to this embodiment. Resputtering using high density plasma does not necessarily need to be performed in a low energy regime if no protection of a dielectric layer is necessary. For example, in some embodiments resputtering with a high density plasma is performed on a substrate that does not have an exposed layer of easily damaged dielectric. Efficient etching on such substrate (e.g. etching with E/D>2) can be achieved using high density plasma and a wide range of RF bias power supplied to the value, e.g., from about 50 to 3000 W. It is, however, important for certain applications that efficient etching (e.g. etching with E/D>2) can be achieved in a low energy regime, e.g., with a wafer RF bias power of less than about 1000 W, preferably less than about 500, and in some cases as low as about 50 W.

The provided methods of high density plasma resputter can be implemented in PVD process chambers as described above, as well as in plasma pre-clean chambers. The pre-clean chambers do not contain a sputter target, and therefore no deposition is occurring simultaneously with etching when resputter is performed in a pre-clean chamber. The use of high density plasmas in these tools will increase the etch rate, while operation in a low energy regime can minimize the dielectric damage, analogously to the process performed in a PVD chamber. Note that plasma pre-clean chambers typically do not contain significant amounts of metal plasma, and resputtering is typically effected by inert gas ions, such as Ar, He, Ne, Kr, and Xe ions, of which argon ions are most commonly used. While in many embodiments, the provided methods can be used in PVD and plasma pre-clean chambers that do not make use of reactive species to assist or modulate the resputtering, in other embodiments, such reactive species, e.g., $N_2$, $H_2$, and $NH_3$, may be present.

High density plasma is formed, in one embodiment, by generating an ultra-high density plasma having a plasma density of, e.g., at least about $10^{13}$ or $10^{14}$ electrons/cm$^3$ (or ions/cm$^3$) at least in one region of the process chamber, thereby increasing the average plasma density within the process chamber and, importantly, at the wafer surface. For example, generating an ultra-high density plasma at some distance from the wafer can increase the plasma density at the wafer surface from about $10^{11}$ ions/cm$^3$ to as high as at least about $5 \cdot 10^{11}$ ions/cm$^3$, preferably to at least about $10^{12}$ ions/cm$^3$. In some embodiments, an ultra-high density plasma does not directly contact the wafer and is centered at a certain distance from the wafer, e.g., the ultra-high density plasma can reside in the vicinity of the metal target of a PVD apparatus. Other embodiments, however, may involve forming an ultra-high density plasma in the vicinity of the wafer.

In those embodiments, where the ultra-high density plasma does not directly contact the wafer, the local plasma density at the wafer surface can be optionally increased by using methods and apparatus described in the commonly assigned patent application U.S. patent application Ser. No. 11/807,182 entitled "Method and apparatus for Increasing Local Plasma Density in Magnetically Confined Plasma" filed on the same day with the present application and naming Pradhan et al. as inventors. This patent application is incorporated herein by reference in its entirety and for all purposes.

Fractional ionization in the plasma at the wafer surface obtained using provided methods, defined as the ratio of ions to the total number of ions and neutral atoms in the vicinity of the wafer (e.g., within about 10 cm from the wafer) is typically high, e.g., at least about 5%, preferably at least about 20%, and even more preferably at least about 40% fractional ionization is achieved. For example, plasmas with fractional ionization of about 5-50% can be formed. These numbers are calculated using a combined number of ions in the plasma, which include a sum of metal ions and inert gas ions and a combined number of neutral atoms, which include a sum of neutral metal atoms and inert gas atoms. Typical plasma used during resputter contains ionized and neutral metal, such as Ta, Ti, and Cu and ionized and neutral inert gas, such as Ar, He, Ne, Kr, and Xe. While in some embodiments formed plasmas may be metal-rich and even may be substantially free of inert gas species, it is often preferred to use inert gas rich plasmas. Some inert gas rich plasmas are characterized by a ratio of inert gas ions to metal ions of at least about 2:1, preferably of at least about 3:1, and, in some cases as high as 5:1.

In some embodiments, e.g., in those embodiments where plasma etching is performed in a plasma pre-clean chamber, the plasma contains only inert gas species and is substantially metal free.

Provided methods can achieve at least about 5%, and in some cases at least about 20% ionization of inert gas at the wafer surface. These numbers refer to the ratio of inert gas ions to the sum of inert gas ions and neutral inert gas atoms both for inert gas rich and for metal rich plasmas.

In the plasma etching or resputtering mode, ions generated by the ultra-high density plasma impinge on the semiconductor wafer substrate and remove or redistribute exposed material on the wafer surface. Ions generated by the ultra-high density plasma include not only the primary ions first formed in the ultra-high density plasma, but also the ions derived from the ultra-high density plasma, e.g., through a series of collision and ionization events occurring in the process chamber. The increased ion flux contacting the wafer results in high etch rates and, thereby, results in improved processing throughput.

An ultra-high density plasma can be generated, in one embodiment, by shaping or confining a plasma with an ultra-high magnetic field. This can be implemented in a variety of types of PVD tools that include one or more magnets capable of confining or shaping the plasma. These tools include magnetrons with three-dimensional targets, planar magnetrons, plasma pre-clean tools, etc. The plasmas that are confined by the magnetic field, can be e.g., DC plasma, capacitively coupled plasmas, inductively coupled plasmas (ICP), and plasmas that are combinations of DC, capacitively and inductively coupled plasmas. In some embodiments, it is preferred to use DC or a capacitively coupled plasma without making use of ICP. The plasmas may contain inert gas ions and/or metal ions at various concentrations. In some embodiments inert gas rich plasmas are used. For example plasmas, that have at least 10% of inert gas species can be used.

It was unexpectedly discovered that by increasing the magnetic field that confines or shapes the plasma, high density low energy plasmas suitable for efficient resputtering, can be obtained. The regime, in which the increased magnetic fields, preferably ultra-high magnetic fields are used will be referred to as a "high confinement" regime and will be used in comparison with a "low confinement" regime effected by lower magnetic fields. In one example a high confinement regime is characterized by a magnetic field strength of at least about 1 Tesla at the surface of the target, while the low confinement regime is characterized by a magnetic field strength of less than about 0.2 Tesla. These exemplary numbers refer to a process chamber or a portion of a process chamber having a volume of about 0.5 m$^3$, wherein the volume refers to a region of an ultra-high density plasma, e.g., to a volume within a three-dimentional target in an HCM. It is understood that higher magnetic fields will be needed to confine plasma in a larger process chamber, and lower magnetic fields will be needed to achieve high confinement in a smaller process chamber. One skilled in the art will understand how to scale process conditions for process chambers of different sizes.

In one embodiment, the high confinement is achieved by confining the plasma with an ultra-high magnetic field proximate the PVD target. In some embodiments, the plasma is confined within a three dimensional metal target. For example, in an HCM, the cup-like cathode can be used for plasma confinement. While three dimensional targets are more efficient in confining the plasma and are used in some embodiments, in other embodiments the plasma can be confined or shaped at the vicinity of a planar target in a planar magnetron, also giving rise to an increased plasma density leading to more efficient resputtering.

Typically, the target is located at some distance from the wafer, e.g., at about 10 to 30 cm from the wafer. In those embodiments where the ultra-high density plasma is confined at the target, the wafer does not come into direct contact with the highly confined ultra-high density. For example, the distance from the wafer to the ultra-high density highly confined plasma can range from about 10 to about 30 cm. It was discovered that the ultra-high density plasma does not need to directly contact the wafer to achieve efficient resputtering. Advantageously, highly confined high density plasma residing at a certain distance from the wafer can produce a sufficient increase in an ion flux and in local plasma density at the wafer surface (e.g., within 1 cm from the wafer) to achieve more efficient sputter etching.

In one embodiment, the ultra-high density plasma has a plasma density of at least about $10^{13}$ electrons/cm$^3$ (or ions/cm$^3$), e.g., about $5 \cdot 10^{13}$ electrons/cm$^3$. Such plasmas can be produced, in one embodiment by generating an ultra high magnetic field of at least about 1 Tesla, e.g., near the target surface. For example, such fields can be generated using electromagnetic coils, circumferentially positioned around a three dimensional target. In general, there is a variety of apparatus configurations that can be used to generate an ultra high magnetic field. Stationary and rotating magnets, which may include electromagnets and permanent magnets (e.g., NdBFe magnets), may be configured to produce ultra high magnetic fields and to confine an ultra high density plasma. The polarity of the magnets, in some embodiments, is configured to confine the ultra-high density plasma within a particular volume.

The high confinement process increases the ionization level in the plasma due to an increase in electron residence times inside the chamber. Preferably, the electron residence times of at least about 0.5 millisecond, and, in some embodiments of at least about 1 milliseconds are achieved, resulting in a dense plasma having high fractional ionization that effects efficient resputtering, e.g., resputtering with an E/D of at least about 2. The increased electron residence time results in increased ionization in the chamber, and, consequently to an increased ion flux directed to the wafer.

Further, in PVD reactors the higher residence time of the electrons and higher plasma density results in an increased number of the neutral metal atoms being ionized once they are sputtered from the target. The higher fractional ionization of sputtered metal atoms from the target results in a lower neutral metal atom flux reaching the surface, thereby lowering the intrinsic deposition rate D, and boosting the E/D ratio. The high confinement process ionizes a larger fraction of the neutral atoms reaching the wafer surface. The neutral metal atoms previously reaching the surface as the deposition part of the flux are converted into positively charged metal ions that participate in the etch part of the flux.

Further, the high confinement process, in some embodiments, can trap metal ions at the target, and redeposit them back to the target. The net metal flux reaching the wafer, can be reduced by this mechanism resulting in a lower D rate.

While the description of a high confinement process focuses herein on a resputtering with a high E/D ratio, it is understood that in some embodiments the high confinement process may be used to effect net deposition through an appropriate adjustment of DC target power and RF wafer power values.

Figure 2:
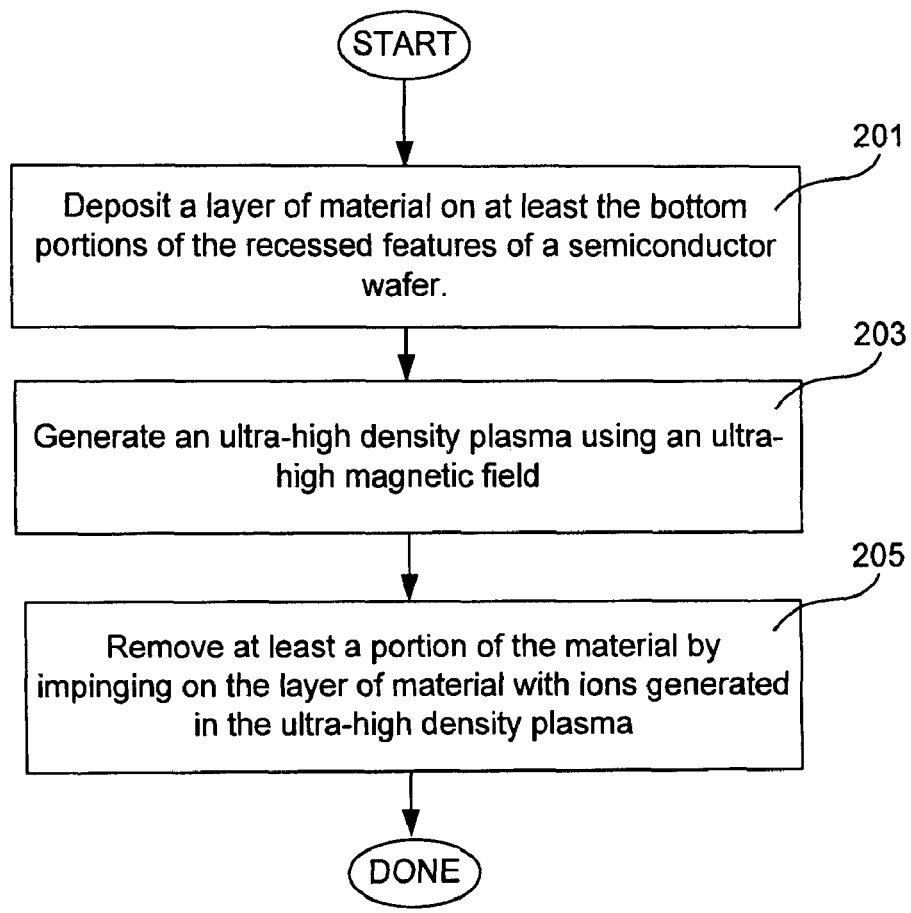
FIG. 2 presents a process flow diagram for a method of removing material on a wafer in accordance with some embodiments presented herein.

A process flow diagram illustrating one embodiment presented herein is shown in FIG. 2. The process starts by depositing a layer of material on at least the bottom portions of the recessed features of a semiconductor wafer in an operation 201. For example a diffusion barrier material, such as Ta, TaN$_x$, Ti, TiN$_x$, W, WN$_x$, Ru, and Co or a copper-containing seed layer is deposited. The material can be deposited by any suitable method, e.g., PVD, CVD, ALD, electroplating and electroless deposition. For example, in one embodiment a diffusion barrier material and/or a seed layer material is deposited by PVD. In some embodiments, ALD may be a preferred method for depositing a diffusion barrier and/or a seed layer material.

After the material has been deposited, it is subjected to plasma etching, e.g., in a PVD chamber or in a plasma pre-clean chamber. In an operation 203 an ultra-high density plasma is generated using an ultra-high magnetic field. In an operation 205 which is typically performed concurrently with 203, at least a portion of the material residing on the wafer is removed by impinging on the layer of material with ions generated in the ultra-high density plasma. For example a tantalum-containing barrier layer material can be etched using a plasma comprising argon and tantalum ions.

It is often preferred, but is not necessary to perform depositing and plasma etching operations in the same process chamber, such as in a PVD chamber (e.g., an HCM or a planar magnetron). In some embodiments depositing and etching can be performed in different chambers. For example deposition may be performed in a PVD chamber followed by plasma etching performed in a plasma pre-clean chamber. In another embodiment, deposition is performed in an ALD chamber followed by resputtering in a PVD chamber. In some embodiments, depositing and etching are performed in one tool without breaking the vacuum and exposing the wafer to an ambient environment. For example, an ALD process chamber, a PVD process chamber, and a plasma pre-clean chamber may be integrated on one platform, such as in an INOVA® tool available from Novellus Systems Inc., San Jose, Calif.

When depositing is performed in a PVD chamber, such as an HCM, the following process conditions can be used. Argon process gas can be supplied into the process chamber, and the chamber pressure can be maintained between about 0.01 mTorr-5 mTorr, preferably at about 0.01-1 mTorr. The temperature at the wafer pedestal can range from about −50 to 600° C., preferably between about −40 and −20° C. An RF bias can be optionally applied to the wafer pedestal at a power level of less than about 3000 W, preferably between about 500 to 1200 W. The DC target power can range from about 10 to about 60 kW, preferably between about 20 and 30 kW. The plasma is confined using a magnetic field of about 0.01-0.2 Tesla at the target for a reactor volume of 0.5 m$^3$.

Plasma etching in the PVD chamber, such as in an HCM according to operations 203 and 205 can be performed as previously described. Argon process gas is used and a process chamber pressure ranging from about 0.01-100 mTorr, preferably between about 0.5 and 20 mTorr is maintained. Similar temperature ranges to the ones used during deposition may be used. An RF wafer bias having a power ranging from about 50 to about 3000 W is applied to the wafer pedestal. When resputtering is performed in a low-energy regime, the RF bias power less than about 1000 W, preferably less than about 500 W, is applied. The DC target power can range from about 1 to about 8 kW, preferably from about 1 to about 6 kW. The plasma is confined using a magnetic field of about 1 Tesla for a reactor volume of 0.5 $m^3$, the field being measured at the target. The magnetic field is generated by applying current of at least 4000 Amp-turns, preferably at least about 4000 Amp-turns to concentric electromagnetic coils circumferentially positioned around the metal target.

In one specific embodiment, deposition and resputtering are performed in the same PVD process chamber. Deposition is performed using a magnetic field of about 0.1 Tesla, DC target power of about 30 kW, wafer RF bias power of about 1500 W, and argon pressure of about 1 mTorr. During resputter the magnetic field is increased to about 1 Tesla, DC target power is decreased to about 5 kW, RF bias power is not increased or decreased to about 500 W, and the pressure is constant at about 1 mTorr.

Figure 3:
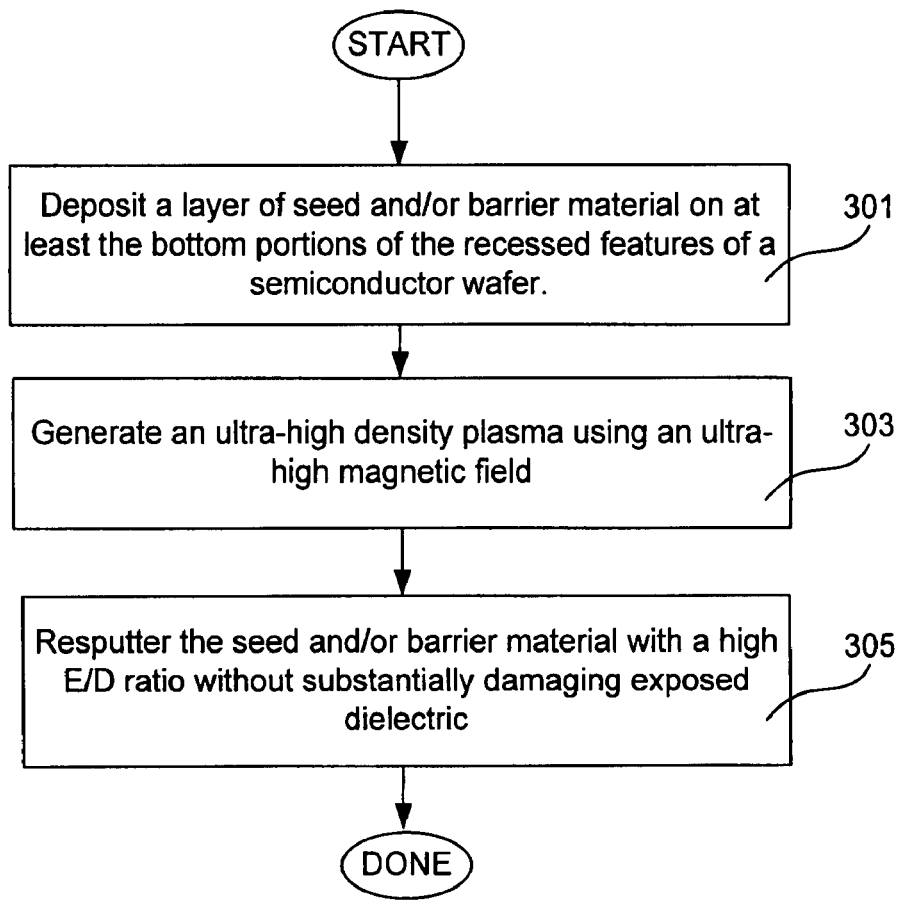
FIG. 3 presents a process flow diagram for a method of removing material on a wafer in accordance with some embodiments presented herein.

In an embodiment illustrated by the process flow diagram shown in FIG. 3, the process starts by operation 301, in which a layer of seed and/or barrier material is deposited on at least the bottom portions of the recessed features on a semiconductor wafer. The operation can be performed analogously to operation 201. Then, in an operation 303 an ultra-high density plasma is generated using an ultra-high magnetic field, and the seed and/or barrier material is resputtered in operation 305 with a high E/D ratio without substantially damaging an exposed dielectric. The exposed dielectric may reside on the wafer prior to resputtering, or, according to one embodiment, the dielectric may be coated with a diffusion barrier layer and/or a seed layer prior to 305, and is exposed while etching of a diffusion barrier material and/or a seed layer material is performed in an operation 305.

The resputtering conditions can be similar to those described for operation 205, but the high-density plasma is maintained at a low energy level minimizing the dielectric damage. This is achieved by using low RF bias power ranging from about 50 to 800 W, preferably less than about 500 W.

Figure 4A:
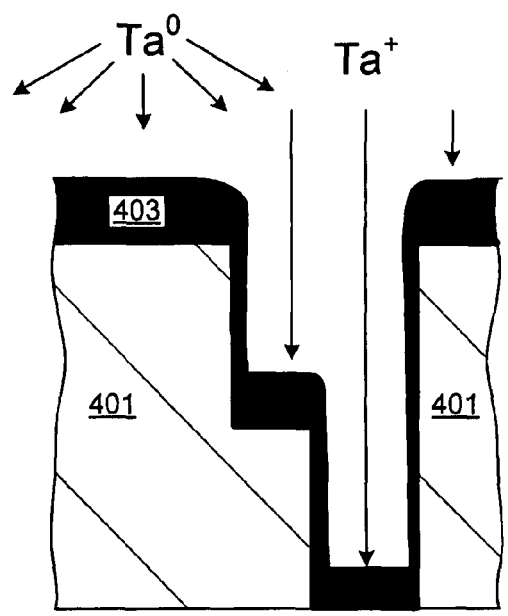
FIG. 4A shows a cross-sectional depiction of a via and a trench illustrating deposition of a diffusion barrier layer.

FIG. 4A shows a cross sectional view of a device structure undergoing deposition of a tantalum diffusion barrier layer. The layer of dielectric 401 is being coated by a layer of tantalum diffusion barrier material 403. Neutral and ionized tantalum is being sputtered from the target onto the wafer coating the exposed surfaces of the wafer, including via and trench bottoms, the field region and, in some cases, the sidewalls. Neutral metal atoms are less directional and preferentially deposit in the field and in the trenches. Ionized metal typically impinges the wafer at a normal degree to the wafer due to the negative wafer bias, and predominantly deposits on horizontal surfaces, such as the field and via bottoms. The process illustrated in FIG. 4A occurs both when E/D ratio is less than 1 (net deposition) and when the E/D ratio is greater than 1 (net etch, or resputter), and describes the mechanism of the intrinsic deposition D.

Figure 4B:
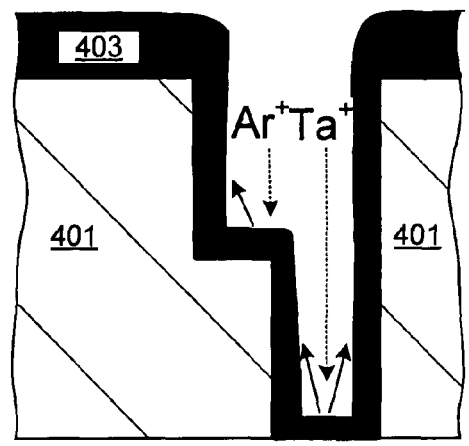
FIG. 4B shows a cross-sectional depiction of a via and a trench illustrating resputtering of a diffusion barrier layer.

Etching of the diffusion barrier is illustrated in the cross-sectional depiction shown in FIG. 4B. The diffusion barrier material 403 resides on the dielectric layer 401 and is being resputtered by argon and tantalum ions impinging on the diffusion barrier material 403. The barrier material is etched from the via and trench bottoms and is redistributed onto the sidewalls of these recesses, thereby improving the sidewall coverage on the features. Resputtering is often used to remove and redistribute material on the wafer to achieve conformal coverage on the features. The process illustrated in FIG. 4B occurs both when E/D ratio is greater than 1 (net etch) and often when the E/D ratio is less than 1 (net deposition), and describes the mechanism of the intrinsic etch E. Thus, in many PVD-based processes, both mechanisms shown in FIG. 4A and FIG. 4B are in play, and the predominance of one of the mechanisms determines whether a net etch or a net deposition is occurring.

Figure 5A:
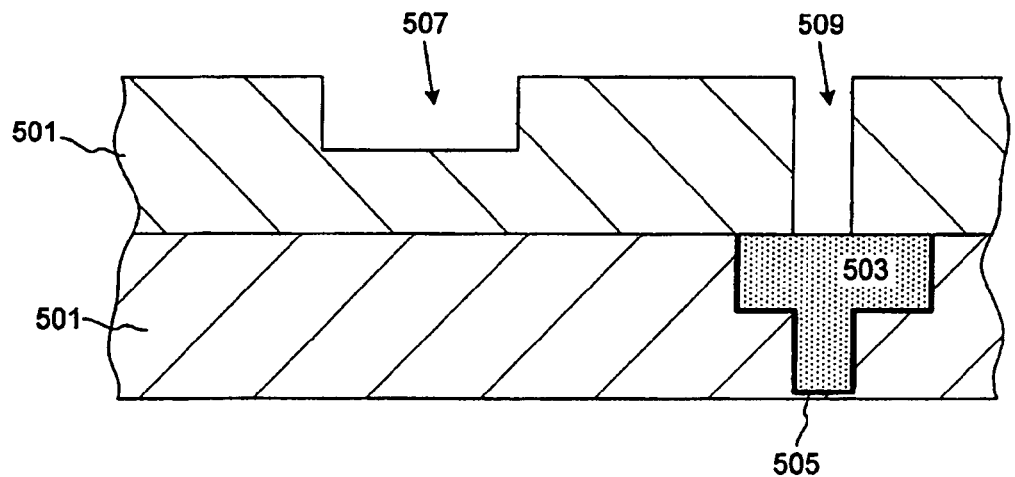
FIGS. 5A-5D show cross sectional depictions of a partially fabricated integrated circuit during barrier layer deposition and during resputtering in a low confinement regime. Microtrenching phenomenon is illustrated.

It is often desirable to use resputter for etching through the via into the underlying copper line. The sequence of wafer processing steps resulting in such punch-through etching is depicted in FIGS. 5A-5D. These figures also illustrate a microtrenching problem. Referring to FIG. 5A, a cross-sectional depiction of wafer substrate is shown. The substrate comprises two layers of dielectric 501, where the top layer is patterned with two recesses, a trench 507, and a via 509. The dielectric 501 may be a low-k dielectric such as carbon doped silicon dioxide, hydrogenated silicon oxycarbide (SiCOH), fluorine doped silicon dioxide, or organic-containing low-k dielectric. A conductive line 503 resides in the underlying dielectric layer directly below the via 509. Conductive lines are most commonly copper lines. The sides and the bottom of the copper line are coated with a diffusion barrier layer 505, which prevents the diffusion of copper into the dielectric layer 501. Etch-stop and antireflective layers, such as 113 and 117 of FIG. 1C, are not shown for clarity reasons.

Figure 5B:
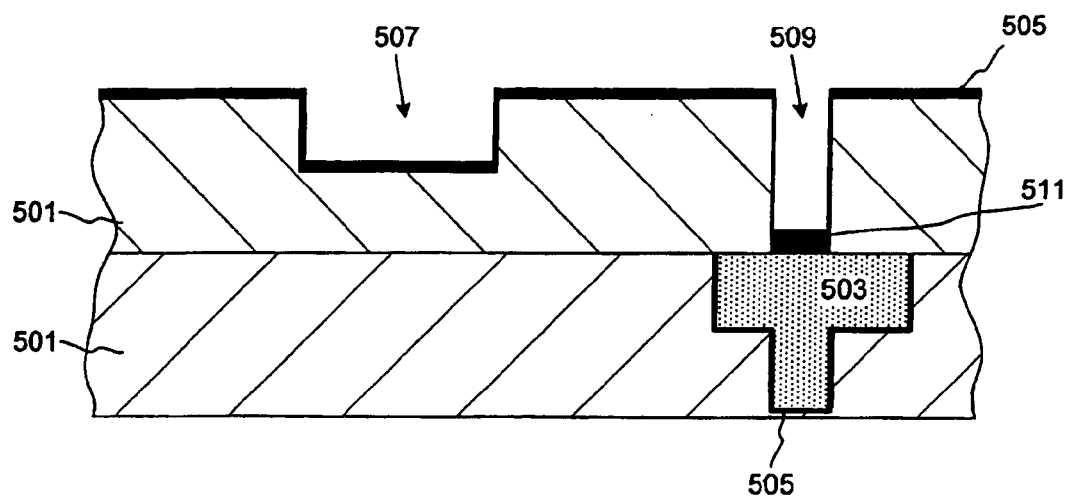
Figure 5C:
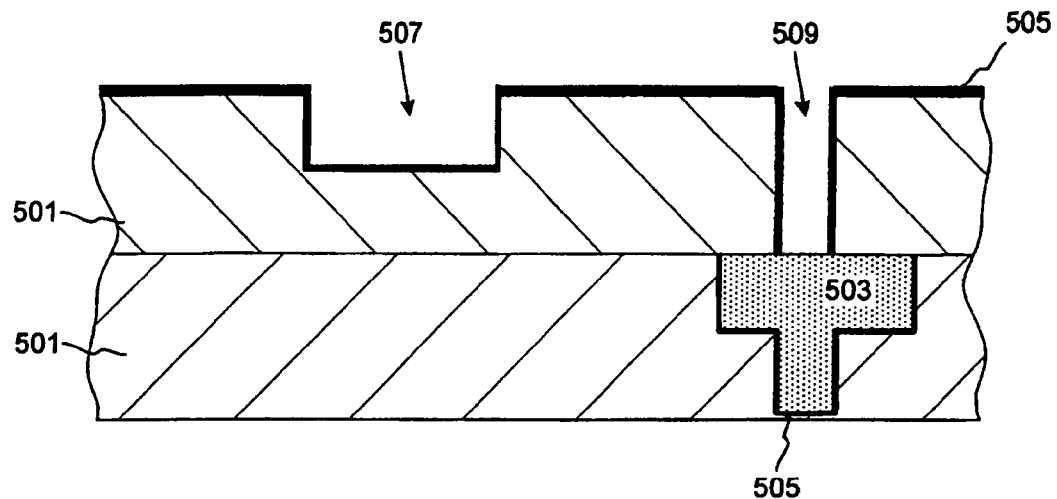

The exposed top dielectric layer is then subjected to a diffusion barrier deposition step resulting in the structure shown in FIG. 5B. It can be seen that after the deposition step, diffusion barrier layer 505 covers the surface of top dielectric layer both in the field and in the recesses. The uniformity of such coverage, however, is low, particularly in the via region. There is significant accumulation of the barrier material in the via bottom 511, and a very thin coverage of the via sidewalls. Uniformity of the via coverage is improved through the resputter step, which leads to the structure shown in FIG. 5C. In this structure all of the barrier material is resputtered from the via bottom onto the sidewalls exposing the underlying copper line. The desired result of this operation is a better, more uniform coverage of the sidewalls in the via.

Figure 5D:
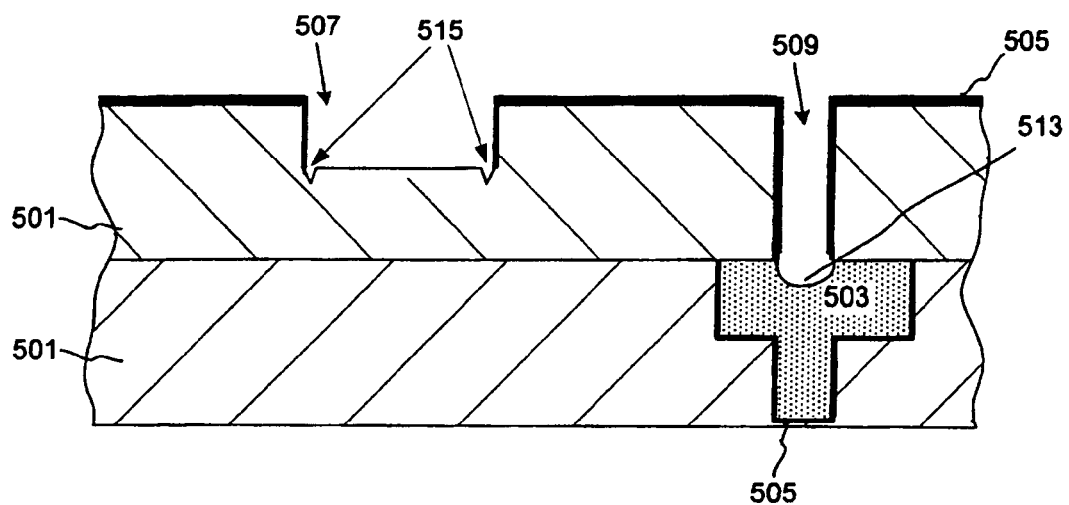

When resputtering is performed further, it etches material of the copper line residing below the via leading to formation of a cavity in the conductive line, known as an anchor recess. The structure with an anchor 513 is shown in FIG. 5D. The anchor is a desired feature in the fabrication of an IC device since it would result in a mechanically strong interconnect when the via is filled with metal. At the same time, resputtering leads to undesired and unintentional changes in the trench region. The bottom of the trench is stripped of the barrier layer, and the dielectric becomes exposed to the impact of high-energy ions. Further resputtering of an exposed dielectric in the trench, especially in a high E/D mode leads to a microtrenching phenomenon. Microtrenches 515 are formed at particular spots in the dielectric layer of the trench bottom, usually in the proximity of the sidewalls. It is believed that reflection of high-energy ions from the trench sidewalls onto particular locations of dielectric in the trench bottom causes increased bombardment of dielectric in these particular sites. The impact of resputtering is, therefore, increased in these spots leading to higher localized etching and formation of microtrenches. This effect is especially pronounced for low-k dielectric, since they are often brittle and easily damaged materials. Microtrenching in silicon dioxide dielectric usually does not occur as readily. Microtrenches can form at any point during the resputtering process when dielectric becomes exposed to argon and/or metal ions. Depending on the relative thickness of the barrier layer in the trench and in the via bottom, the trench bottom dielectric can become exposed in the beginning or at the end of barrier layer resputtering in the via or during the etch-back of copper line during anchor formation.

Microtrenches are viewed as undesired features in IC devices since they may contribute to level-to-level current leakage, result in poor adhesion of subsequently deposited layers leading to decreased reliability of the integrated circuit. Referring to FIG. 5D, the microtrenching phenomenon is illustrated for a resputter process carried out in a conventional low confinement regime characterized by the highest density of plasma not exceeding about $10^{12}$ electrons/cm$^3$, which was confined using magnetic fields not exceeding 0.2 Tesla.

In an embodiment presented herein, the resputter step is performed in a high confinement regime characterized by the highest density of an ultra high density plasma of at least about $5 \cdot 10^{12}$ electrons/cm$^3$, preferably at least about $10^{13}$ electrons/cm$^3$. Such ultra-high density plasma is generated using high confinement with ultra-high magnetic fields, which can be at least about 5 times greater than conventionally used fields. For example, a magnetic field of at least about 1 Tesla at least at one location in the chamber (e.g., in the vicinity of the target) is used to confine the plasma.

Figure 5E:
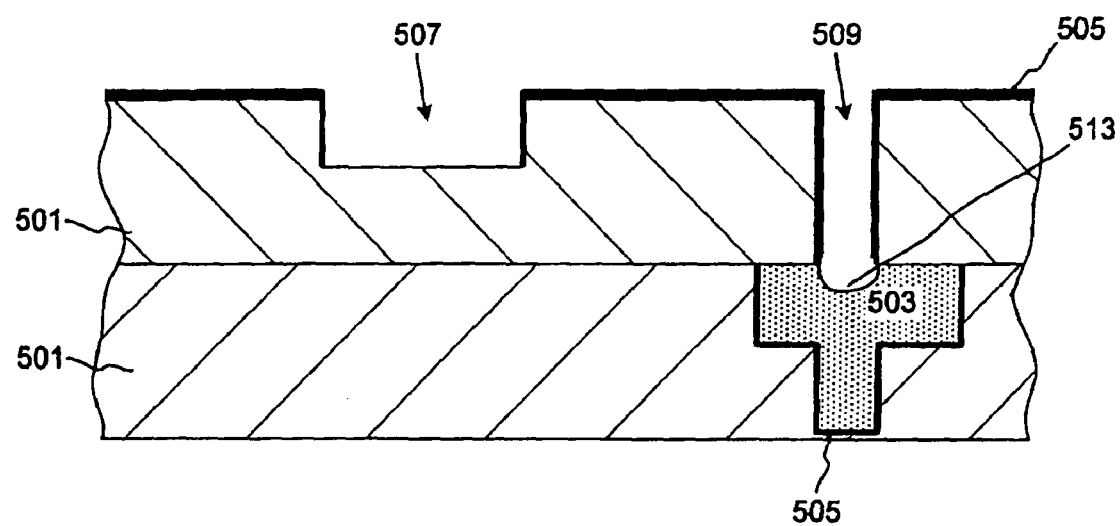
FIG. 5E presents a cross sectional depiction of a partially fabricated integrated circuit obtained by a high plasma density resputter process and illustrates the absence of microtrenches.

When wafer layers undergo resputtering in the high confinement regime using a low energy high density plasma, the damage to dielectric layer is minimal and microtrenching is reduced or eliminated. This is illustrated in FIG. 5E which presents the cross-sectional depiction of a wafer portion, subjected to the same processing steps as structure shown in FIG. 5D, except that resputtering is performed at high confinement. It can be seen that microtrenches did not form in the trench region 507.

During low confinement resputter the microtrenches are formed when the inert gas ions of high energy are arriving to the trench sidewall at grazing angles and are reflected onto the bottom of the trench. The reflected ions arrive to particular spots on the bottom of the trench and etch dielectric material at these spots causing microtrenching. When the confinement is increased, the increased ion flux at the wafer surface can achieve efficient resputtering with ions of relatively low energy (e.g., during operation at a relatively low bias) thereby avoiding the microtrenching.

While the present invention can be practiced in many different types of apparatus, two main types of iPVD apparatus, hollow cathode magnetron (HCM) and planar magnetron, will now be briefly described. Hollow cathode magnetron is an apparatus carrying a three-dimensional sputter target. The present invention is not limited to a specific cup-like geometry of an HCM target and can be used in conjunction with three-dimensional targets of a plurality of shapes. Further, as mentioned, provided methods can be carried out in a plasma pre-clean chamber which typically does not include a sputter target. The apparatus suitable for practicing methods described herein should be configured to create a magnetic field that can sufficiently confine a plasma to produce efficient resputtering. One or several magnets are typically used for plasma confinement.

Figure 6A:
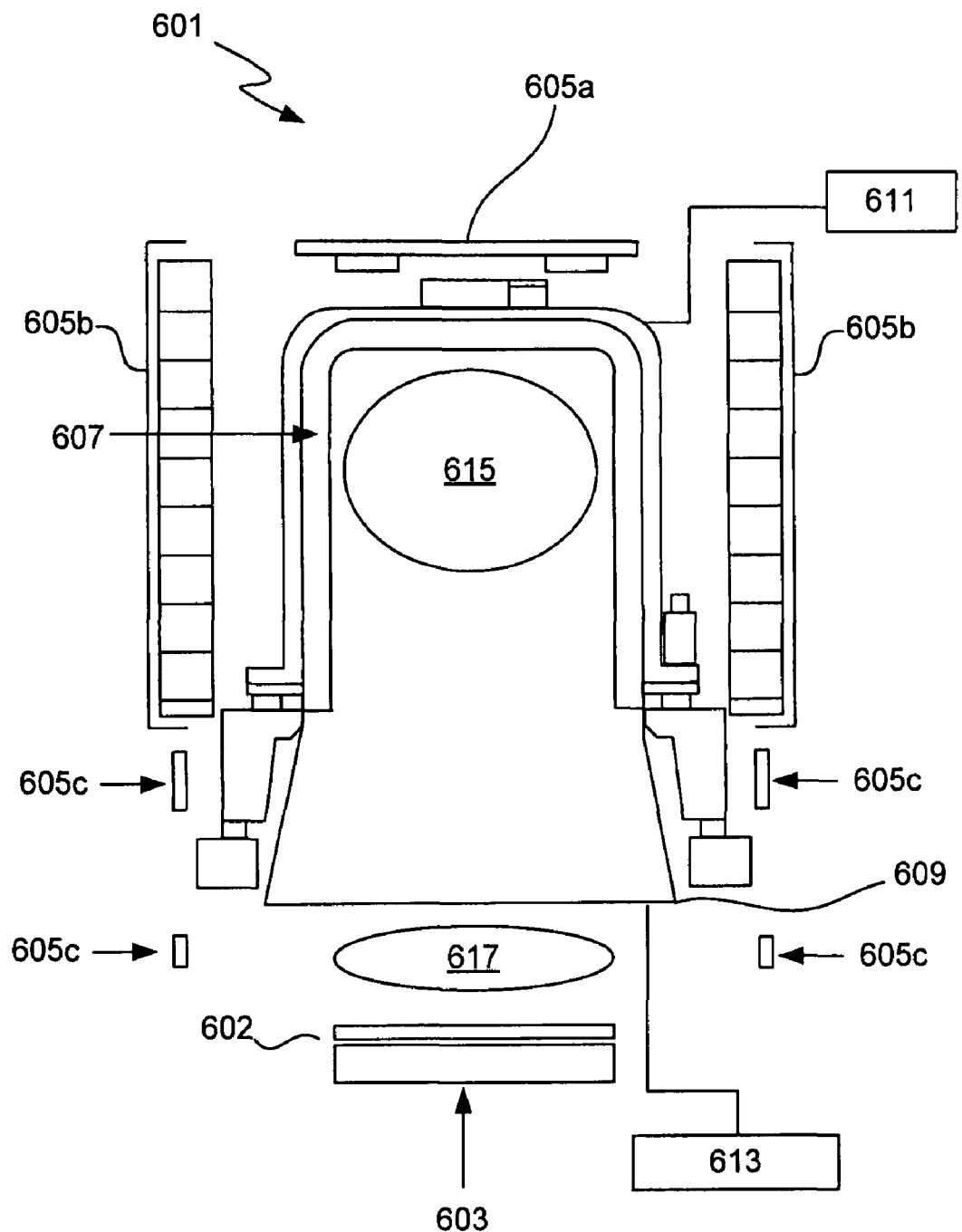
FIG. 6A is a cross sectional depiction of the hollow cathode magnetron (HCM) apparatus suitable for practicing methods described herein.

FIG. 6A presents a cross sectional view of one type of an HCM sputtering apparatus that can be used in accordance with the invention. The HCM apparatus has two main components, the source 601, in which a plasma is created and maintained, and the RF bias electrostatic chuck (ESC) pedestal 603, which secures the wafer 602 and applies an RF bias on the wafer, if needed. In this example, the source 601 contains a top rotating magnet 605a, several concentric annular side electromagnets 605b-605c, circumferentially positioned around the process chamber, and a sputter target 607, operated at a negative DC bias. One or several shields may be positioned within the chamber next to the chamber sidewalls, to protect the sidewalls from the sputtered material. While the shield 609 is often referred as an anode, in a conventional configuration, this shield operates at a floating potential and is not additionally electrically biased.

The cathode target 607 generally has a hollow cup-like shape so that plasma formed in the source can be concentrated within this hollow region. The cathode target 607 also serves as a sputter target and is, therefore, made of a metal material such as tantalum or copper, which is to be deposited onto a substrate.

An inert gas, such as argon, is introduced through a gas inlet into the hollow region of the cathode target 607 powered by a DC source to form a plasma. The pump 613 is positioned to evacuate or partially evacuate the process chamber. The control of pressure in the process chamber can be achieved by using a combination of gas flow rate adjustments and pumping speed adjustments, making use of, for example, a throttle valve or a baffle plate.

An intense magnetic field is produced by permanent magnets or electromagnets 605a-605b within the cathode target region. Additional permanent magnets or electromagnets 605c are arranged downstream of the cathode target so that different currents can be applied to each electromagnet, thereby producing an ion flux and a controlled deposition and/or etch rate and uniformity.

The side permanent magnets or electromagnets 605b can be configured to produce an ultra-high density plasma 615 within the hollow region of the cathode target. In one embodiment, the polarity of the magnetic field generated by the electromagnetic coils 605b and by the downstream permanent magnets or electromagnets 605c is selected to be opposite, such that a region of null magnetic field, known as a separatrix exists between the ultra-high density plasma 615 and a region of plasma 617 adjacent to the wafer surface. Typically the plasma located at the separatrix corresponds to a region of a lower density plasma residing between the two lobes of higher density plasma 615 and 617. In one embodiment, the separatrix is positioned at the bottom level of the cathode target. In other embodiments, polarity of a magnetic field produced by permanent magnets or electromagnetic coils 605b can be adjusted such that a separatrix can be moved upward to reside within the hollow region of the target. While the presence of the separatrix is advantageous for a more efficient plasma confinement within the hollow region of the target, the provided methods can be practiced with or without such arrangement.

In one example configuration, side magnets 605b include four annular electromagnets, which can be independently adjusted to generate an ultra-high magnetic field inside the target 607. Example parameters for the four side magnets 605b operating in a high confinement regime will be now provided. In this regime, four annular electromagnets E, F, G, H (comprised within the side magnets 605b, in the ascending order) are configured to provide a magnetic field having one polarity. The downstream electromagnets 605c are configured to provide a magnetic field of a different polarity. The null magnetic field separatrix resides between the lowest of the 605b electromagnets and the highest of the 605c electromagnets. In one embodiment, the current applied to the coil of the highest of the 605b magnets, coil H is about 4000 Amp-turns. The currents applied to lower-lying coils G, F, E, and D are about 4000 Amp-turns per each coil. An ultra high magnetic field of about 1 Tesla is formed at the target 607, and a highly confined ultra high density plasma 615 having a plasma density of about $10^{13}$ electrons/cm$^3$ is generated. In turn, the average plasma density in the HCM apparatus increases, resulting in an increase of the plasma density in a plasma 617 residing in the proximity of the wafer 602. The density of plasma 617 can be, in this example about $10^{12}$ electrons/cm$^3$.

Additional electromagnets 605c arranged downstream of the cathode target are configured so that different currents can be applied to each electromagnet, thereby controlling an ion flux, deposition and/or etch rate and uniformity in the proximity of the wafer. A floating shield 609, existing in equilibrium with the floating plasma potential, is used, in conjunction with the source electromagnets to shape the plasma distribution at the target mouth. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40-−20° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 605b and 605c, power levels and current levels applied to the coils, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, plasma density within the chamber, process gas composition and flow rates, temperature, pressure, plasma conditions such as RF power levels and the RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck and DC power levels applied to the target, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing the methods described herein. For example, the instructions can specify the parameters needed to generate an ultra-high density plasma (e.g., a plasma having a plasma density of at least about $10^{13}$ ions/cm$^3$) and to perform resputtering and plasma etching using ions generated in the ultra-high density plasma. Specifically, the instructions may specify forming an ultra-high magnetic field (e.g., a field of at least about 1 Tesla), configured to confine an ultra-high density plasma.

Figure 6B:
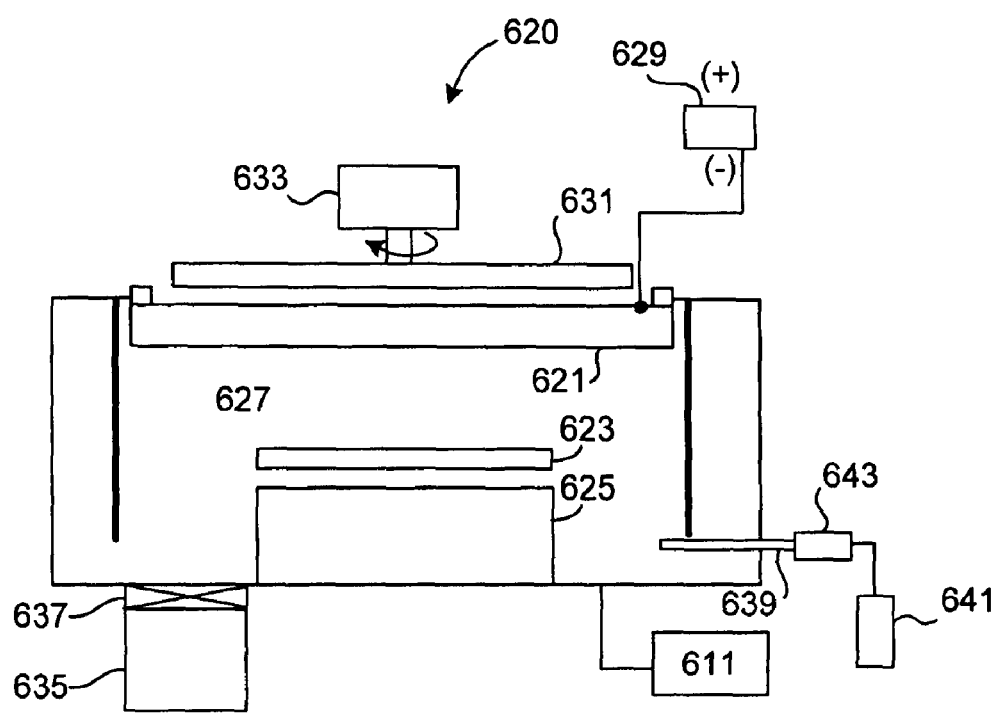
FIG. 6B is a cross sectional depiction of a planar magnetron suitable for practicing methods described herein.

FIG. 6B shows a schematic representation of a planar magnetron 620 which can also be used to practice present invention. Target 621, a circular, planar block of material to be deposited, is spaced from the wafer 623, which is mounted on a heating stage 625 in chamber 627. A DC power supply 629 is used to apply a dc field to target 621, establishing a plasma in the chamber below target 621. A circular magnet 631 mounted above the target is rotated by motor 633 setting up a magnetic field extending through target 621 into the region between the target 621 and wafer 623. The rotating magnet 631 can be used to increase the magnetic field within the process chamber, thereby producing a higher-density plasma within the process chamber, which can be used for resputtering and plasma etching. Cryopump 635 connected to chamber 627 via valve 637 is used to evacuate the chamber. Process gas injector 639 is connected to process gas supply 641 via mass flow controller 643. A sputtering gas is introduced into chamber 627 via an injector 639. It is understood that the structure of module 620 is exemplary only. The methods of present invention may be practiced in other types of planar magnetrons, such as ones having ICP sources. In other embodiments, magnetrons without ICP sources are preferred.

Figure 6C:
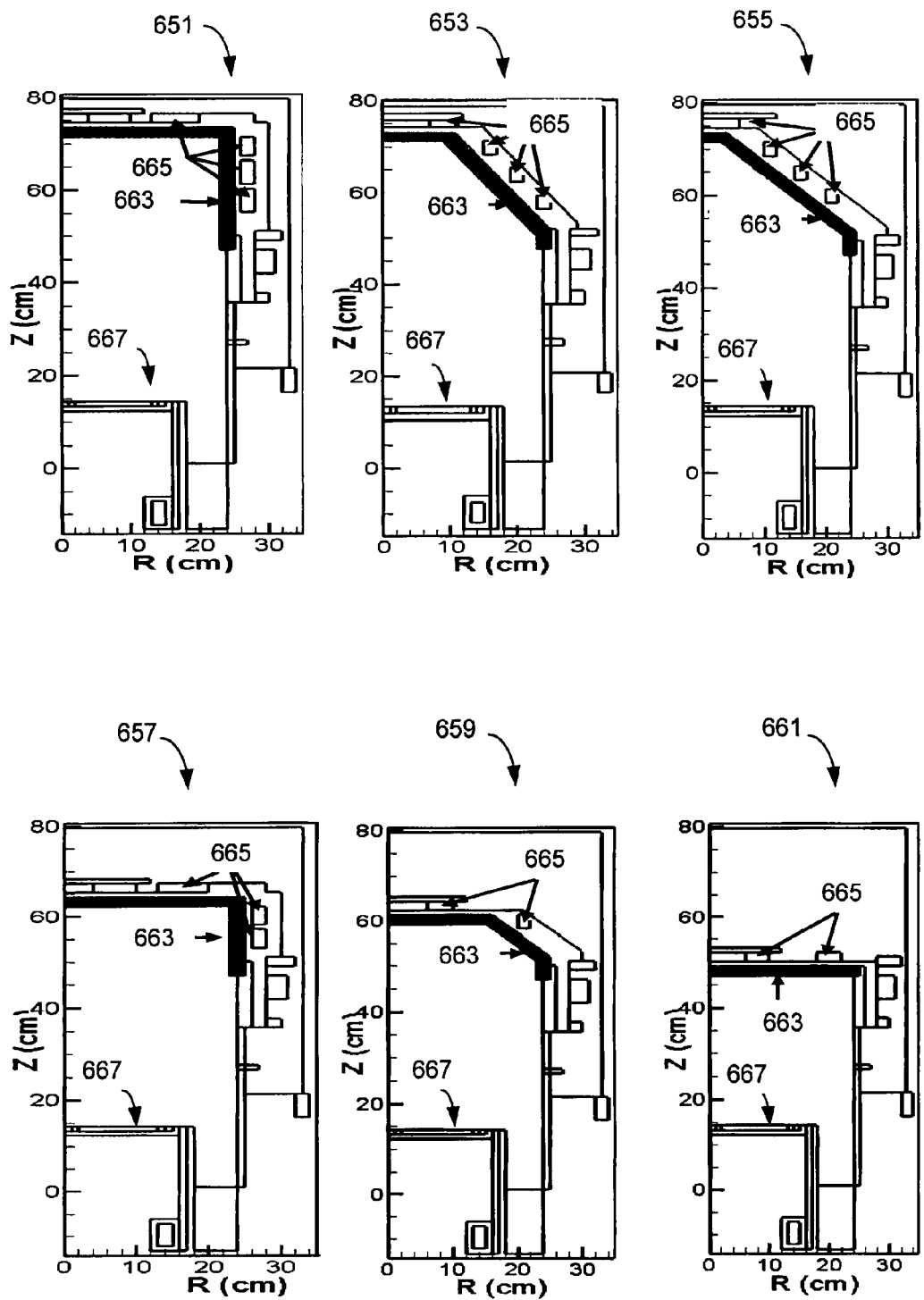
FIG. 6C presents schematic partial cross-sectional views for various magnetron configurations suitable for practicing methods described herein.

The effect of increased magnetic field on an average plasma density within a process chamber was explored for different types of magnetrons. Simulation modeling was carried out for magnetrons having different shapes of the target cathode and different arrangements of electromagnetic coils. Examples of magnetron configurations are shown in FIG. 6C, where 651, 653, 655, 657, 659, and 661 are schematic depictions of magnetron process chambers which may be used to practice the provided methods. Partial cross-sectional schematic presentations are shown, with thw y-axis showing the apparatus height in centimeters and the x-axis presenting an apparatus radius in centimeters.

In configurations presented in FIG. 6C a planar or a three-dimensional target 663 is located above the wafer pedestal 667. The magnetic field is generated using permanent magnets or electromagnetic coils 665 residing in the proximity of the target. The coils are typically circumferentially positioned above and/or around the target. The process chamber 651 illustrates a tall configuration having 18" inch diameter and a three-dimensional target with a 90° sidewall. The process chamber 653 illustrates a tall configuration having 18" inch diameter and a three-dimensional target with a 60° sidewall. The process chamber 655 illustrates a tall configuration having 18" inch diameter and a three-dimensional target with a 45° sidewall. The process chamber 657 illustrates a short configuration having 18" inch diameter and a three-dimensional target with a 90° sidewall. The process chamber 659 illustrates a short configuration having 18" inch diameter and a three-dimensional target with a 45° sidewall. The process chamber 661 illustrates a planar configuration having 18" inch diameter.

Figure 7:
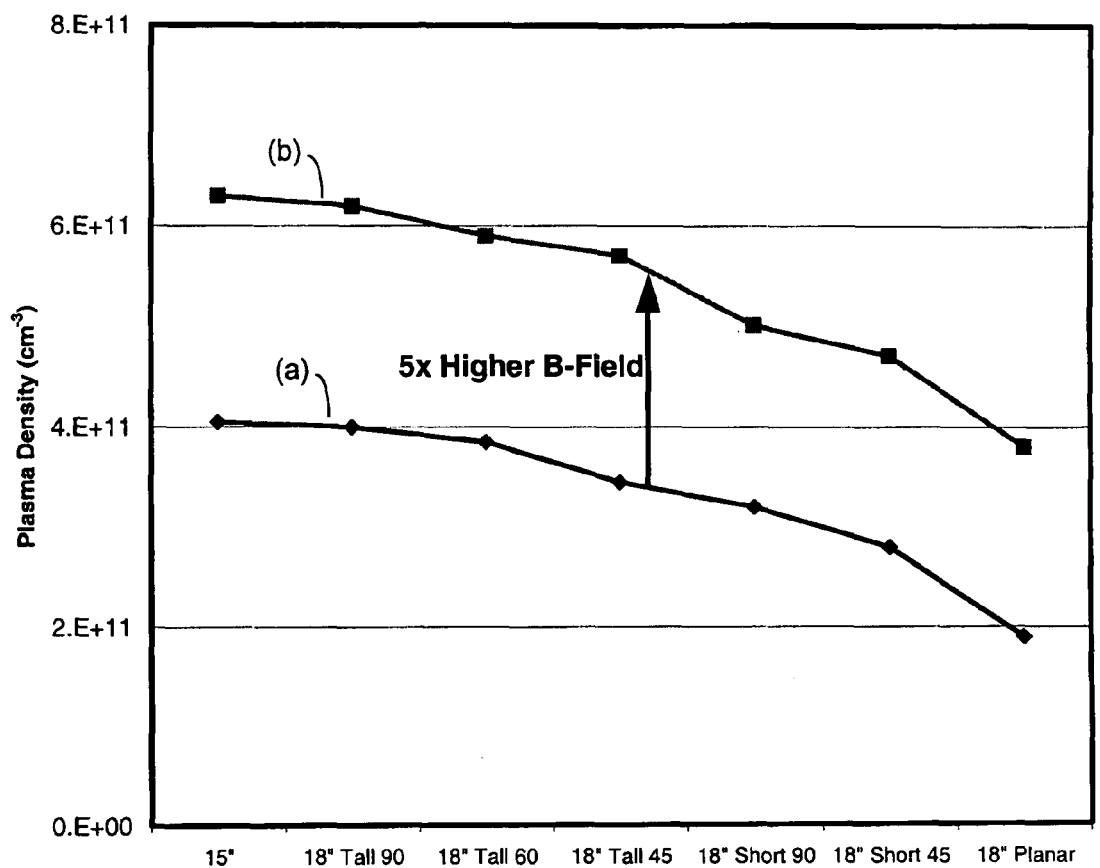
FIG. 7 presents a simulation plot illustrating increase in the average reactor plasma density effected by an increase in a magnetic field for various magnetron configurations shown in FIG. 6C.

FIG. 7 presents results of calculations for an effect of an increase in magnetic field on an average plasma density within a chamber for different magnetron configurations shown in FIG. 6C. Curve (a) presents an average plasma density in a chamber for different apparatus types operating at a conventionally used magnetic field of about 0.1 T at the target. The obtained reactor average plasma density ranges from about $2 \cdot 10^{11}$ electrons/cm$^3$ for a planar magnetron to about $4 \cdot 10^{11}$ electrons/cm$^3$ for a tall magnetron having a three-dimensional target with a 90° sidewall. Curve (b) presents simulated results for a reactor average plasma density in a chamber for different apparatus types operating at an increased magnetic field that is about 5 times greater than the field used in (a). It can be seen that an almost two-fold increase in the reactor average plasma density is expected for each type of magnetron with such a magnetic field increase. In some embodiments, higher magnetic fields are used to obtain higher plasma density to effect more efficient resputter. For example, the magnetic field can be increased at least about 5, 10 or 15 times from a conventionally used level to achieve high density plasma leading to high E/D ratios during resputter. In some embodiments the magnetic fields are increased to obtain an ultra-high density plasma of at least about $10^{13}$ electrons/cm$^3$ at some region within the chamber and to increase the average plasma density within the chamber to at least about $10^{12}$ electron/cm$^3$. In one example, a 15-fold increase in magnetic field strength can result in such plasma regime in a planar magnetron.

Figure 8:
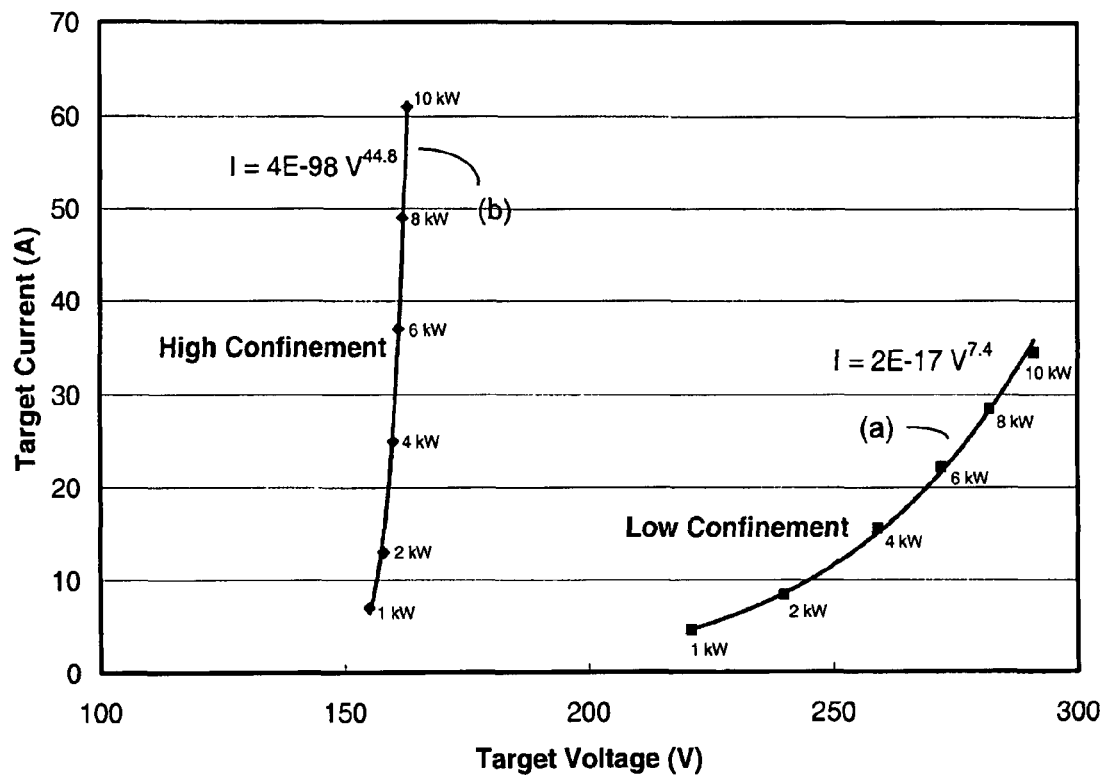
FIG. 8 presents characteristic target I-V curves for a conventional low confinement process (curve a) and for the high confinement process described herein (curve b).

An increased magnetic field and high plasma confinement lead to a distinct I-V response from the target, that allows high ionization levels in a plasma at lower target power levels. FIG. 8 illustrates I-V characteristics for the target cathode in a low confinement (curve a) and in a high confinement (curve b) process. In a conventional low confinement process an increase in the target current typically is accompanied with an increase in a target voltage as shown by curve (a). The higher confinement process illustrated with curve (b) allows a much higher target current for a given target power as compared to the low confinement process. The increase in target current is directly proportional to an increase in ionization levels in a plasma. The I-V curves for the target were fitted with a power curve law, shown in FIG. 8. The exponent n is an indicator of a plasma density. In the presented example the value of this exponent is 7.4 for the low-confinement curve a, and is 44.8 for a high confinement process shown in curve b. The high confinement plasma regimes presented in some embodiments described herein are characterized by a target I-V response that is highly insensitive to voltage (e.g., by n values of at least about 40, preferably at least about 45). Since the sputter rate of material coming off the target is determined by the target power and in many embodiments does not depend on the confinement efficiency, the higher confinement ability allows for a higher level of ionization at the same sputter rate at the target.

Figure 9:
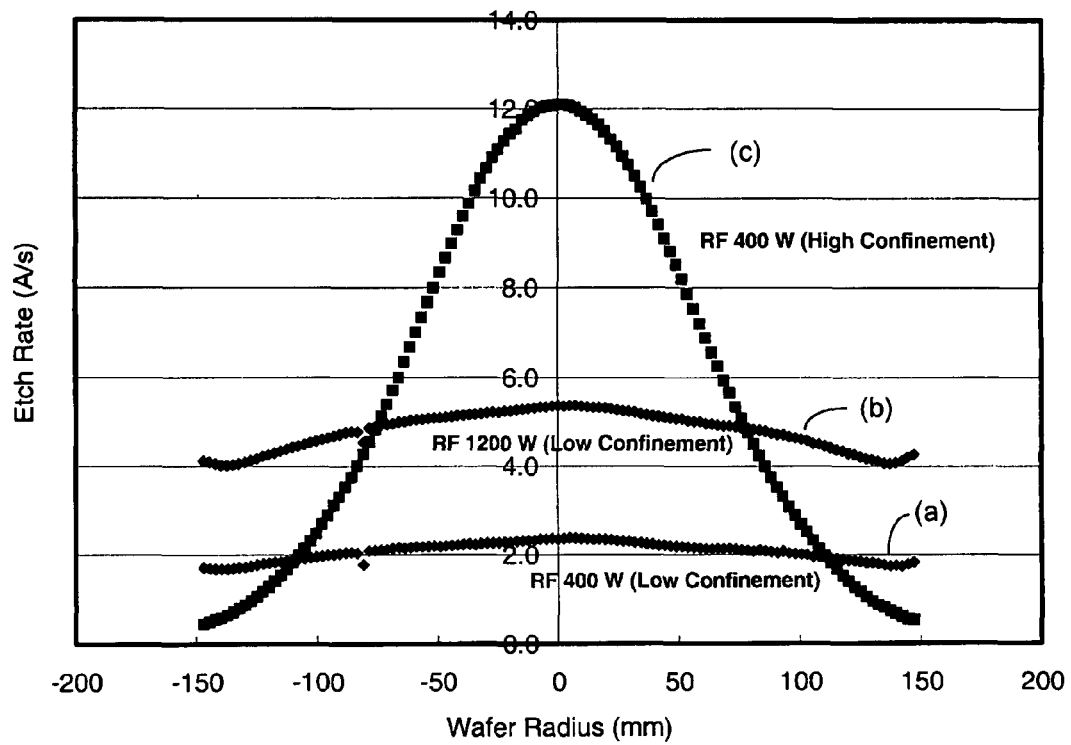
FIG. 9 presents experimentally measured etch rates across the wafer for a conventional low confinement processes (curves a and b) and for a high confinement process presented herein (curve c).

As previously explained, the increased plasma density throughout the chamber, and an increased ion flux at the wafer can dramatically increase the etch rate. FIG. 9 presents experimental data illustrating etch rates of Ta barrier layer across the wafer surface for low confinement processes illustrated by curves (a) and (b) and for a high confinement process illustrated by curve (c). For a low confinement process (a), characterized by a magnetic field of about 0.2 Tesla at the target surface, the etch rates of about 2 Å/s were obtained when an RF bias at a 400 W power level is applied to the wafer pedestal for a 300 mm wafer. The etch rate can be increased to about 5 Å/s, as shown in curve be for a low confinement process by increasing the RF bias at the wafer pedestal to 1200 W. In a high confinement process depicted by curve (c) and characterized by a high magnetic field of about 1 Tesla at the target surface, etch rates of greater than about 6, and greater than about 10 Å/s were obtained at a low wafer bias of 400 W. Thus, about 6-fold increase in an etch rate at the center of the wafer was observed in a high confinement process compared to a low confinement process.

Figure 10:
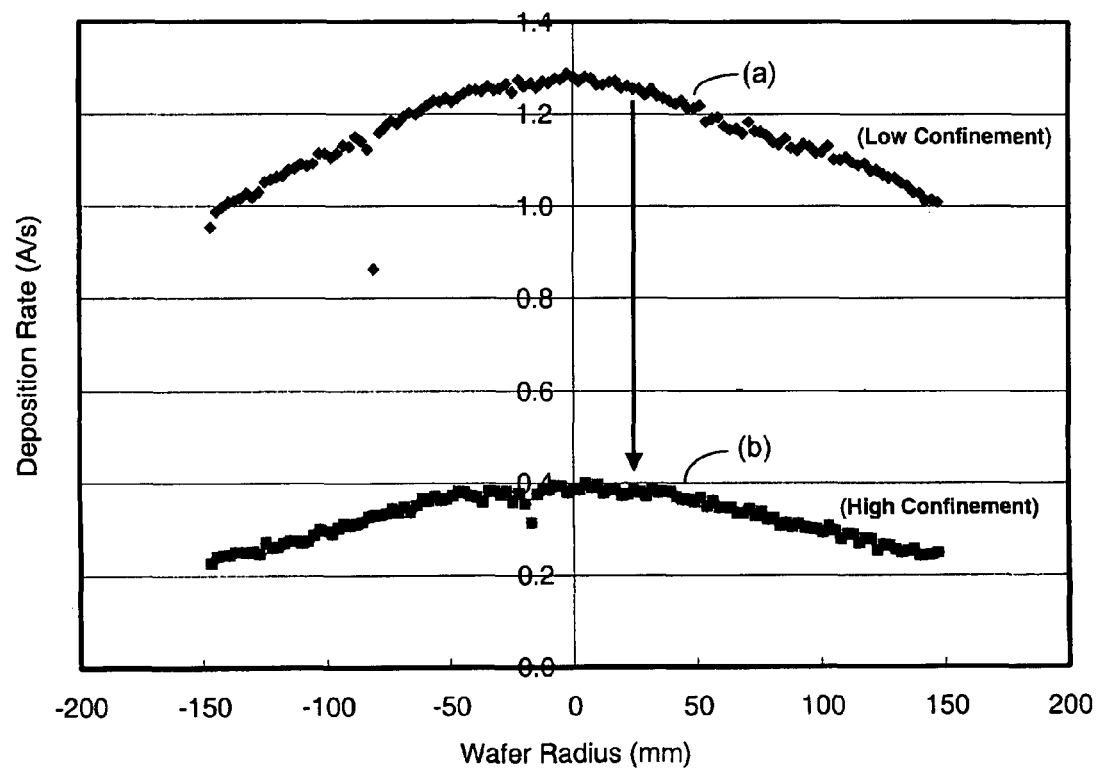
FIG. 10 presents experimentally measured deposition rates across the wafer for a conventional low confinement process (curve a) and for a high confinement process presented herein (curve b).

As shown in FIG. 10 illustrating the deposition rates across the wafer for a low confinement (curve (a)) and a high confinement process (curve (b)), the rates of deposition can be significantly lower in a high confinement regime. For example, deposition rates of about 1-1.3 Å/s were obtained for Ta resputter in a low confinement process, characterized by a magnetic field of about 0.2 Tesla at the target surface, RF bias power of 400 W, and a DC target power of 2 kW. The deposition rates of only about 0.2-0.4 Å/s were obtained in a high confinement process characterized by a magnetic field of about 1 Tesla at the target surface, RF bias of 400 W, and a DC target power of 2 kW.

Figure 11:
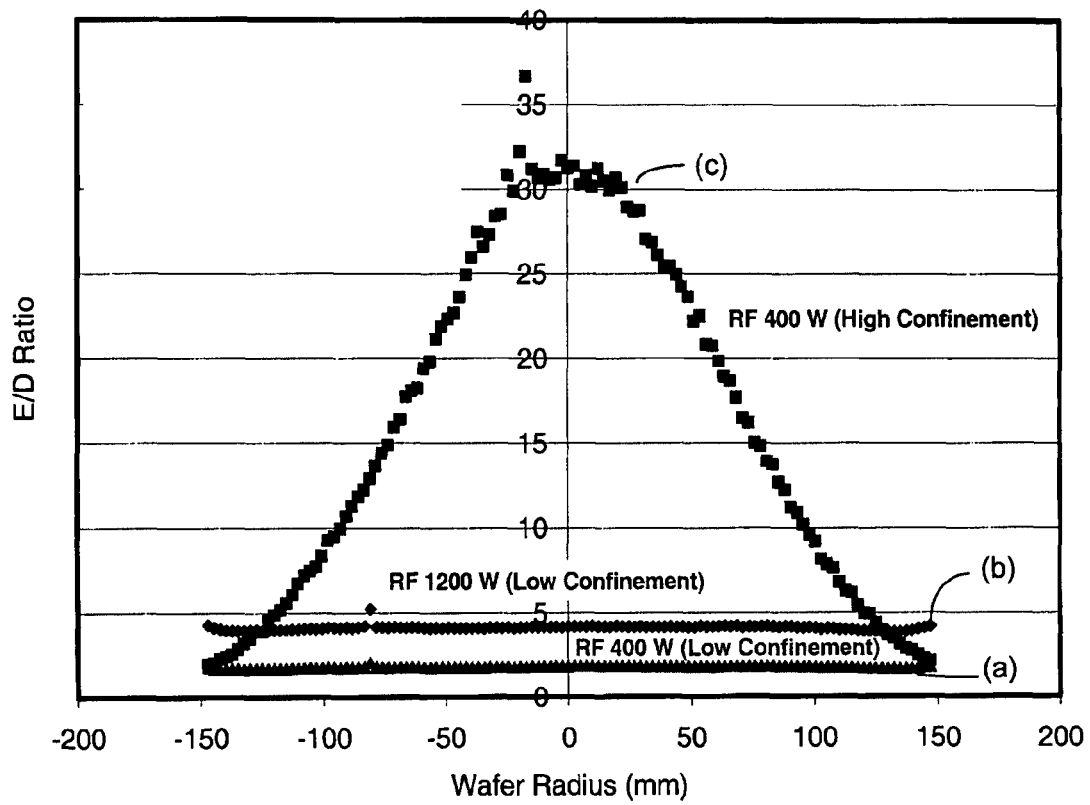
FIG. 11 presents experimentally measured E/D ratios across the wafer for conventional low confinement processes (curves a and b) and for a high confinement process presented herein (curve c).

Consequently, when resputtering in a high confinement regime is performed, very high E/D ratios can be achieved even with a low RF wafer bias power applied to the wafer. FIG. 11 illustrates E/D ratios across the wafer for a low confinement processes (0.2 Tesla magnetic field, 400 W RF bias power, 2 kW DC target power) illustrated by curve (a), a low confinement process conducted under the same conditions but at a higher RF bias power of 1200 W illustrated by curve (c), and a high confinement process (1 Tesla magnetic field, 400 W RF bias power, 2 kW DC target power). It can be seen that an E/D ratio of about 2 was achieved for a low confinement process (a) at a power level of 400 W applied to the pedestal, and an E/D ratio of about 4 was achieved in a low confinement process (b) when the RF bias of 1200 W was used. The high confinement process achieves E/D ratios ranging from about 2 to about 30 at a low bias power of 400 W.

Thus a more than ten-fold increase was achieved at the wafer center for resputtering at an RF bias of 400 W.

Figure 12A:
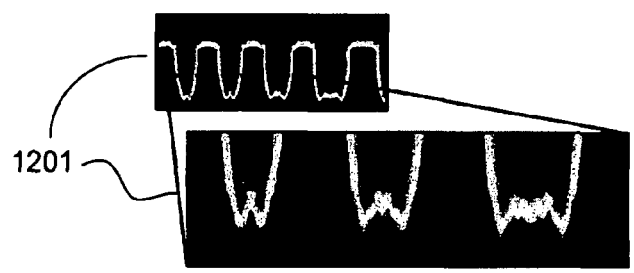
FIGS. 12A-12B present experimental data showing scanning electron micrograph (SEM) images of device cross-sections illustrating a trench array and a via chain fabricated using low confinement (12A) and high confinement (12B) resputtering. Elimination of microtrenching in a high confinement process is illustrated.
Figure 12A:
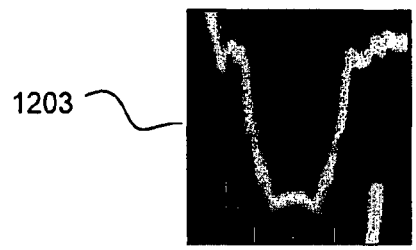
Figure 12B:
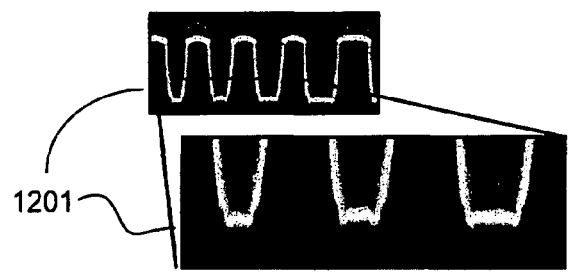
Figure 12B:
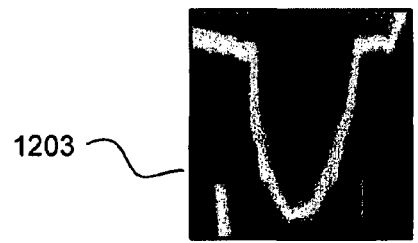

Therefore, efficient resputtering with a high density low energy plasma can be performed at low RF bias power levels. Resputtering in this regime eliminates the dielectric damage, such as microtrenching, as illustrated in FIG. 12A and FIG. 12B. FIG. 12A presents a scanning electron micrigraph (SEM) image of a trench array 1201 and a portion of a via chain 1203 illustrating an anchor obtained using a conventional low confinement process. In this process, Ta barrier layer was resputtered with plasma confined with a 0.2 Tesla magnetic field at the target, using RF bias power of 400 W, and a target DC power of 2 kW. Resputtering was performed using argon process gas at a pressure of 1 mTorr. The expanded view of the trench array 1201 shows three trenches in a layer of low-k dielectric (shown in black) lined with a barrier material (shown in white). It can be seen that significant microtrenching is present at the trench bottoms. A 425 Å deep anchor recess residing on a copper line is shown in the portion of a via chain depicted 1203.

FIG. 12B presents a SEM image of a trench array 1205 and a portion of a via chain 1207 illustrating an anchor obtained using a high confinement process presented herein. In this process, Ta barrier layer was resputtered with plasma confined with a 1 Tesla magnetic field at the target, using RF bias power of 400 W, and a target DC power of 2 kW. It can be seen that in the trench array 1205 obtained using the presented process no microtrenching is present at the trench bottoms. A deeper anchor recess of about 425 Å deep was obtained using efficient resputter (shown in the portion of a via chain 1207). It was, therefore, illustrated that deep anchoring could be efficiently performed in the presence of exposed low-k dielectric, without causing significant dielectric damage, in a high confinement resputter process.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of removing material on a semiconductor wafer having a recessed feature, the method comprising:
    (a) receiving the semiconductor wafer, wherein the semiconductor wafer has a layer of material coating at least a bottom portion of the recessed feature;
    (b) generating an ultra-high density plasma comprising inert gas ions, the plasma having a plasma density of at least about $10^{13}$ electrons/cm$^3$, the ions having a mean ion energy of less than about 250 eV at a wafer surface; and
    (c) removing at least a portion of the material by impinging on the layer of material with ions generated in (b) by etching the material while simultaneously depositing the material with an etch rate to deposition rate ratio (E/D) of at least about 2 at least at one location on the wafer.

2. The method of claim 1, wherein the ultra-high density plasma further comprises metal ions.

3. The method of claim 1, wherein the ultra-high density plasma does not comprise metal ions.

4. The method of claim 1, wherein operations (a), (b), and (c) are performed in a pre-clean chamber.

5. The method of claim 1, wherein (c) comprises resputtering the layer of material.

6. The method of claim 1, wherein the layer of material comprises a barrier layer material.

7. The method of claim 6, wherein the barrier layer material is selected from the group consisting of Ta, TaN$_x$, Ti, TiN$_x$, W, WN$_x$, Ru, and Co.

8. The method of claim 1, wherein the layer of material comprises a metal seed layer material.

9. The method of claim 8, wherein the seed layer material comprises copper or a copper alloy.

10. The method of claim 1, wherein the wafer comprises portions of dielectric coated with a diffusion barrier layer and/or a seed layer during (a), wherein the dielectric is exposed to inert gas ions during (c), and wherein (c) comprises removing at least a portion of the barrier layer and/or the seed layer material, without substantially damaging the exposed dielectric.

11. The method of claim 10, wherein the exposed dielectric has a dielectric constant of less than about 3.5.

12. The method of claim 10, wherein the dielectric is selected from the group consisting of a carbon-doped silicon dioxide, a fluorine-doped silicon dioxide, and an organic-containing low-k dielectric material.

13. The method of claim 10, wherein the dielectric is a porous dielectric.

14. The method of claim 1, further comprising, prior to (a), depositing the layer of material by a method selected from the group consisting of PVD, CVD, ALD, electroplating, and electroless deposition.

15. The method of claim 14, wherein depositing the layer of material and removing the portion of material are performed in one process chamber.

16. The method of claim 15, wherein the process chamber comprises an HCM.

17. The method of claim 15, wherein the process chamber comprises a planar magnetron.

18. The method of claim 1, wherein (c) is performed without making use of an inductively coupled plasma.

19. The method of claim 1, wherein during (c), the inert gas at the wafer surface is ionized to at least about 5%.

20. The method of claim 1, wherein the inert gas at the wafer surface is ionized to at least about 20%.

21. The method of claim 1, wherein generating the ultra-high density plasma comprises generating a magnetic field of at least about 1 Tesla in a volume of less than about 0.5 m$^3$, wherein the volume comprises an inert gas.

22. The method of claim 1, wherein the ultra-high density plasma does not contact the wafer.

23. A method of depositing material on a semiconductor wafer having a recessed feature, the method comprising:
    (a) depositing a layer of the material on the wafer to coat at least the bottom portion of the recessed feature;
    (b) generating an ultra-high density plasma comprising inert gas ions, the plasma having a plasma density of at least about $10^{13}$ electrons/cm$^3$,
    (c) removing at least a portion of the material by impinging on the layer of material with ions, wherein the ion flux at a wafer surface is greater than about $5 \cdot 10^{15}$ ions/cm$^2$ s$^1$ of the exposed surface area of the wafer, wherein a mean ion energy is less than about 250 eV at the exposed surface area of the wafer, and wherein removing at least a portion of the material comprises etching the material while simultaneously depositing the material with an etch rate to deposition rate ratio (E/D) of at least about 2 at least at one location on the wafer.

24. A method of resputtering a metal-containing material on a semiconductor wafer having a layer of low-k dielectric, the method comprising:
    simultaneously etching and depositing the metal-containing material on the wafer by contacting a wafer surface with inert gas ions and neutral metal atoms and/or ionized metal atoms generated from an ultra-high density plasma having a plasma density of at least about $10^{13}$ electrons/cm$^3$, such that an etch rate to deposition rate (E/D) ratio at least at one location on the wafer is at least about 2, and wherein simultaneously etching and depositing comprises contacting the low-k dielectric with the inert gas ions and neutral metal atoms and/or ionized metal atoms without causing substantial damage to the low-k dielectric.

25. A method of resputtering a material on an electrically biased semiconductor wafer, the method comprising: simultaneously etching and depositing the material on the wafer by contacting a wafer surface with inert gas ions and neutral metal atoms and/or ionized metal atoms generated from an ultra-high density plasma having a plasma density of at least about $10^{13}$ electrons/cm$^3$, such that an etch rate to deposition rate (E/D) ratio at least at one location on the wafer is at least about 2, wherein a bias power at the wafer does not exceed 1000 W, and wherein a mean ion energy is less than about 250 eV at the wafer surface.

\* \* \* \* \*